(12) United States Patent
Rao et al.

(10) Patent No.: US 6,584,598 B2
(45) Date of Patent: Jun. 24, 2003

(54) APPARATUS FOR OPTIMIZED CONSTRAINT CHARACTERIZATION WITH DEGRADATION OPTIONS AND ASSOCIATED METHODS

(75) Inventors: Guruprasad G. Rao, Austin, TX (US); E. Keith Howick, Jr., Liberty Hill, TX (US)

(73) Assignee: Silicon Metrics Corporation, Austin, TX (US)

( * ) Notice: Subject to any disclaimer, the term of this patent is extended or adjusted under 35 U.S.C. 154(b) by 0 days.

(21) Appl. No.: 09/904,463

(22) Filed: Jul. 13, 2001

(65) Prior Publication Data

US 2002/0144214 A1 Oct. 3, 2002

Related U.S. Application Data

(60) Provisional application No. 60/269,373, filed on Feb. 16, 2001, and provisional application No. 60/270,763, filed on Feb. 22, 2001.

(51) Int. Cl.[7] .............................................. G06F 17/50
(52) U.S. Cl. ............................................. 716/2; 716/10
(58) Field of Search ...................................... 716/2, 10

(56) References Cited

U.S. PATENT DOCUMENTS 5,790,415 A * 8/1998 Pullela et al. ............... 364/489

OTHER PUBLICATIONS

Copending U.S. patent application Ser. No. 09/904,630, filed Jul. 13, 2001, "Apparatus And Methods For Constraint Characterization With Degradation Options" (Atty. Docket No. SIME:002).

James E. Buchanan, BiCMOS/CMOS Systems Design, 1991, pp. 191–206.

J. Juan–Chico et al, "Delay Degradation Effect In Submicronic CMOS Inverters," presented at PATMOS, 1997, 5 pgs.

Daniel Auvergne et al., "Signal Transition Time Effect On CMOS Delay Evaluation," IEEE Transactions On Circuits and Systems–I: Fundamental Theory and Applications, vol. 47, No. 9, Sep. 2000, pp. 1362–1369.

Lindsay Kleeman et al., "Metastable Behavior In Digital Systems," IEEE Design and Test of Computers, Dec. 1987, pp. 4–19.

Charles Dike, "A Metastability Primer," Signetics, Note AN219, Nov. 1989, pp. 1–3.

Yusuf Leblebici, "Design Considerations For CMOS Digital Circuits With Improved Hot–Carrier Reliability," IEEE Journal Of Solid–State Circuits, vol. 31, No. 7, Jul. 1996, pp. 1014–1024.

Lee–Sup Kim et al., "Metastability of CMOS Latch/Flip–Flop," IEEE Journal of Solid–State Circuits, vol. 25, No. 4, Aug. 1990, pp. 942–950.

J. Juan–Chico et al., "CMOS Inverter Maximum Frequency Of Operation Due To Digital Signal Degradation," Electronics Letters, vol. 33, No. 19, Sep. 11, 1997, pp. 1619–1621.

* cited by examiner

Primary Examiner—M. Tran
(74) Attorney, Agent, or Firm—O'Keefe, Egan & Peterman, LLP

(57) ABSTRACT

A circuit-characterization system includes a computer. The computer uses a model of an operation of the circuit to characterize first and second constraints of the circuit and to select values for the first and second constraints, respectively. The computer modifies the values selected for the first and second constraints to obtain optimized values for the first and second constraints. The optimized values of the first and second constraints avoid an invalid region of operation of the circuit.

24 Claims, 21 Drawing Sheets

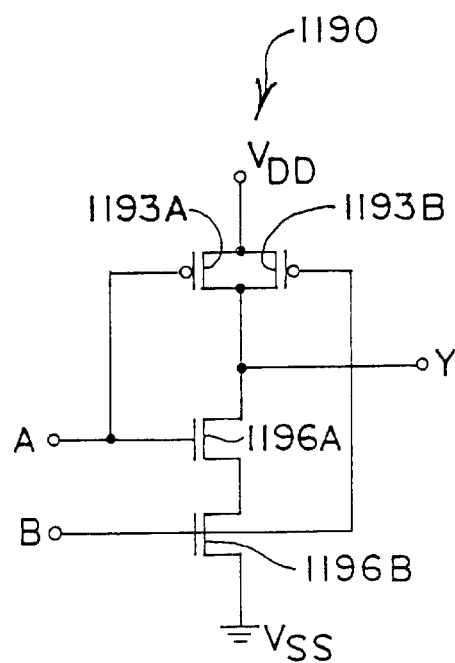
FIG. 6A
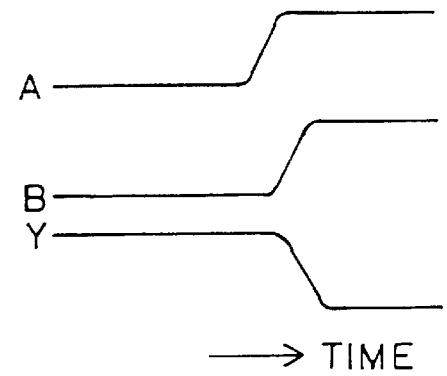
FIG. 6C
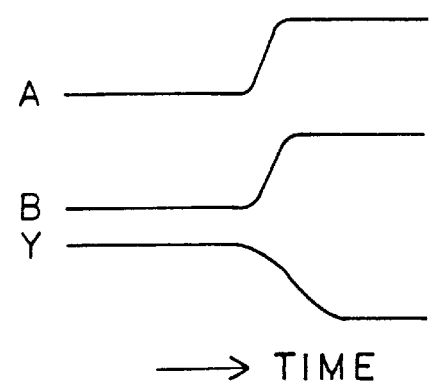
FIG. 6D
FIG. 6B

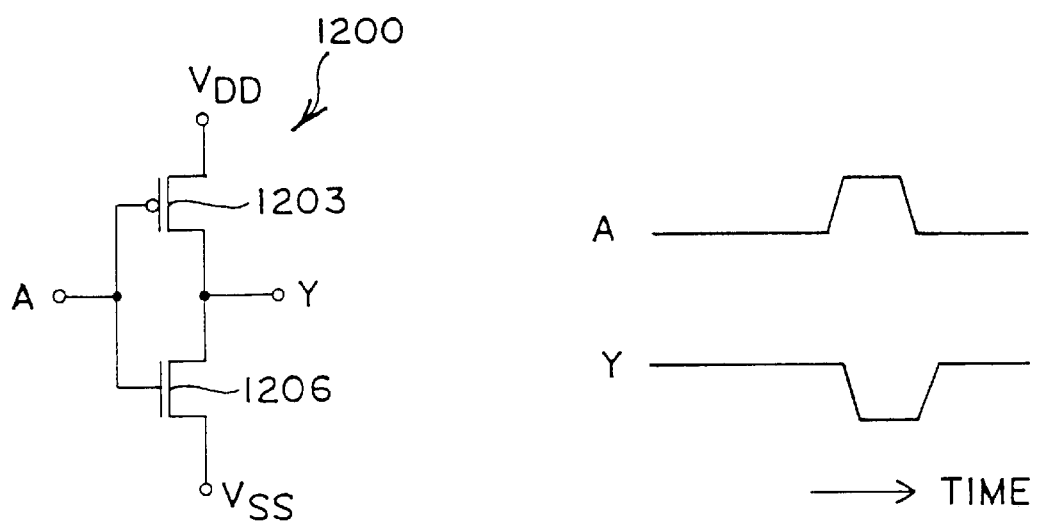
FIG. 7A
FIG. 7C
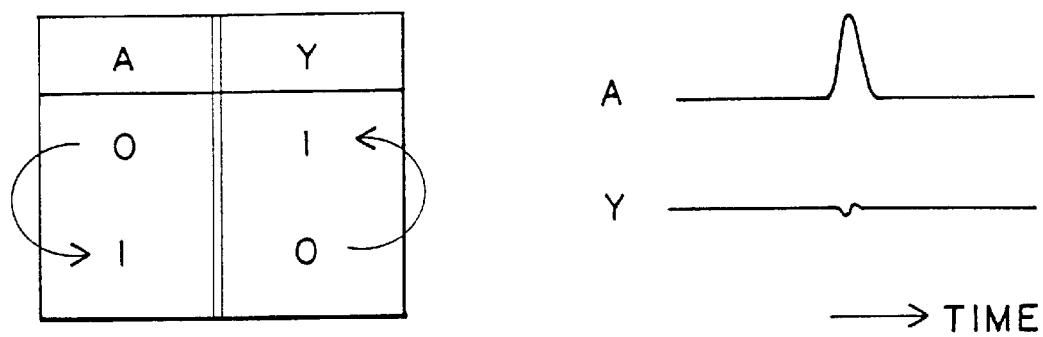
FIG. 7B
FIG. 7D

APPARATUS FOR OPTIMIZED CONSTRAINT CHARACTERIZATION WITH DEGRADATION OPTIONS AND ASSOCIATED METHODS

CROSS-REFERENCE TO RELATED APPLICATIONS

This patent application relates to concurrently filed, commonly owned U.S. patent application Ser. No. 09/904,630, titled "Apparatus and Methods for Constraint Characterization with Degradation Options."

Furthermore, this patent application claims priority to the following U.S. Provisional Patent Applications:

Application Ser. No. 60/269,373, titled "Apparatus and Methods for Using Constraint Dependency to Make Appropriate Performance Risk Tradeoffs Between Timing, Power and Noise," and filed on Feb. 16, 2001; and Application Ser. No. 60/270,763, titled "Apparatus and Methods for Using Constraint Dependency to Make Appropriate Performance Risk Tradeoffs Between Timing, Power and Noise," and filed on Feb. 22, 2001. The present patent application incorporates by reference the above patent applications.

TECHNICAL FIELD OF THE INVENTION

This invention relates to characterizing electronic circuits and, more particularly, to characterizing constraints of electronic circuits.

BACKGROUND

Complexity of a typical electronic circuit, for example, an integrated-circuit device, has increased dramatically. At the same time, the length of the design cycle has typically remained unchanged or has become shorter. To meet the shorter design cycles for the more complex designs, circuit designers increasingly rely on characterization of the designs in order to identify any problems early in the design cycle. The short design cycles and the complexity of the integrated-circuit devices make cost- and time-prohibitive an approach that characterizes a design by actually realizing the design in hardware and testing it in a laboratory.

As an alternative to actually building a prototype of the design, circuit designers have increasingly relied on electronic design automation (EDA) tools, such as circuit simulation and characterization tools. Effective circuit simulation tools provide a way for the designer to simulate the behavior of a complex design, identify any problems, and make alterations and enhancements to the circuit before arriving at a final design. That iterative design process has in turn improved the reliability of the end-products that incorporate a given circuit design. The effectiveness of a circuit characterization or simulation tool depends on several criteria, for example, accuracy, reliability, and predictability. Traditional approaches to characterizing circuit constraints or various attributes of circuits, for example, intrinsic delay, output transition time, or power, sometimes fail to meet those criteria. In other words, the traditional approaches may fail to provide results that match the behavior of an actual prototype relatively closely. The failure of the traditional characterization techniques results in increased costs, longer design cycles, less reliable end-products, and/or less-than-optimal designs. A need therefore exists for accurate and reliable techniques for circuit characterization and circuit-constraint characterization.

SUMMARY OF THE INVENTION

The invention contemplates constraint characterization in electronic cells or circuits. One aspect of the invention relates to circuit-characterization systems. In one embodiment of the invention, a circuit-characterization system includes a computer configured to characterize a first constraint of a circuit according to a model of an operation of the circuit to select a value for the first constraint. The computer characterize a second constraint of the circuit according to the model of the operation of the circuit to select a value for the second constraint. The computer modifies the values selected for the first and second constraints to obtain optimized values for the first and second constraints, respectively. The optimized values of the first and second constraints avoid an invalid region of operation of the circuit.

In another embodiment, a circuit-characterization system includes a computer configured to characterize a first constraint of an electronic circuit according to a model of an operation of the circuit to acquire a value for the first constraint. The computer also characterizes a second constraint of the circuit according to the model of the operation of the electronic circuit to acquire a value for the second constraint. The second constraint is characterized independently of the characterization of the first constraint. The computer obtains optimized values of the first and second constraints, by modifying the values acquired for the first and second constraints, respectively, so as to avoid an invalid meta-stable region of operation of the circuit.

More specifically, the computer is configured to characterize the first constraint by using a first degraded characteristic of the electronic circuit obtained according to a first degradation option. The computer is also configured to characterize the second constraint by using a second degraded characteristic of the circuit obtained according to a second degradation option. In exemplary embodiments, the first and second degradation options are selected from among an absolute-from-breakdown option, a unity-slope option, and a normalized intersection option.

A second aspect of the invention relates to computer program products for constraint characterization. In one embodiment of the invention, a computer program product includes a computer application adapted for processing by a computer. The computer application causes the computer to characterize first and second constraints of a circuit according to a model of an operation of the circuit to select a value for the first and second constraints, respectively. The computer application also causes the computer to modify the values selected for the first and second constraints to obtain optimized values for the first and second constraints, respectively. The optimized values of the first and second constraints avoid an invalid region of operation of the circuit.

In another embodiment, a computer application, adapted for processing by a computer, causes the computer to characterize first and second constraints of an electronic circuit according to a model of an operation of the circuit to acquire values for the first and second constraints, respectively. The second constraint is characterized independently of the characterization of the first constraint. The computer application further causes the computer to obtain optimized values of the first and second constraints, by optimizing the values acquired for the first and second constraints, respectively, so as to avoid an invalid meta-stable region of operation of the circuit.

More specifically, the application causes the computer to characterize the first and second constraints of the electronic circuit by using a first degraded characteristic of the circuit obtained according to a first degradation option, and by using a second degraded characteristic of the circuit obtained according to a second degradation option, respectively. In exemplary embodiments, the first and the second degradation options are selected from among an absolute-from-breakdown option, a unity-slope option, and a normalized intersection option.

A third aspect of the invention relates to methods for characterizing circuits. In one embodiment of the invention, a method for circuit characterization includes characterizing a first constraint of a circuit according to a model of an operation of the circuit to select a value for the first constraint. The method further includes characterizing a second constraint of the circuit according to the model of the operation of the circuit to select a value for the second constraint. The method modifies the values selected for the first and second constraints to obtain optimized values for the first and second constraints, respectively, so as to avoid an invalid region of operation of the circuit.

In another embodiment, a method of characterizing an electronic circuit includes characterizing first and second constraints of the circuit to acquire values for the first and second constraints, respectively. The second constraint is characterized independently of the characterization of the first constraint. The method further includes obtaining optimized values of the first and second constraints, by optimizing the values acquired for the first and second constraints, respectively, so as to avoid an invalid meta-stable region of operation of the circuit.

More specifically, the method includes characterizing the first constraint by using a first degraded characteristic of the electronic circuit obtained according to a first degradation option. The method further includes characterizing the second constraint by using a second degraded characteristic of the circuit obtained according to a second degradation option. In exemplary embodiments, the method includes selecting the first and second degradation options from among an absolute-from-breakdown option, a unity-slope option, and a normalized intersection option.

DESCRIPTION OF THE DRAWINGS

The appended drawings illustrate only exemplary embodiments of the invention and therefore should not limit its scope. The disclosed inventive concepts lend themselves to equally effective embodiments other than the exemplary embodiments shown in the drawings. The same numerals used in more than one drawing denote the same, similar, or equivalent functionality, components, or blocks, unless the description of the drawing states otherwise.

FIG. 6A illustrates a circuit diagram of a two-input NAND gate.

FIG. 6B shows a truth table for the two-input NAND gate of FIG. 6A.

FIG. 6C depicts a set of input waveforms and a corresponding output waveform of the NAND gate of FIG. 6A.

FIG. 6D illustrates another set of input waveforms and a corresponding output waveform of the NAND gate of FIG. 6A.

FIG. 7A shows an inverter circuit that has an input and an output.

FIG. 7B depicts a truth table for the inverter of FIG. 7A.

FIG. 7C illustrates an input waveform and a corresponding output waveform of the inverter of FIG. 7A.

FIG. 7D shows another input waveform and a corresponding output waveform of the inverter of FIG. 7A.

DETAILED DESCRIPTION OF THE INVENTION

Figure 1:
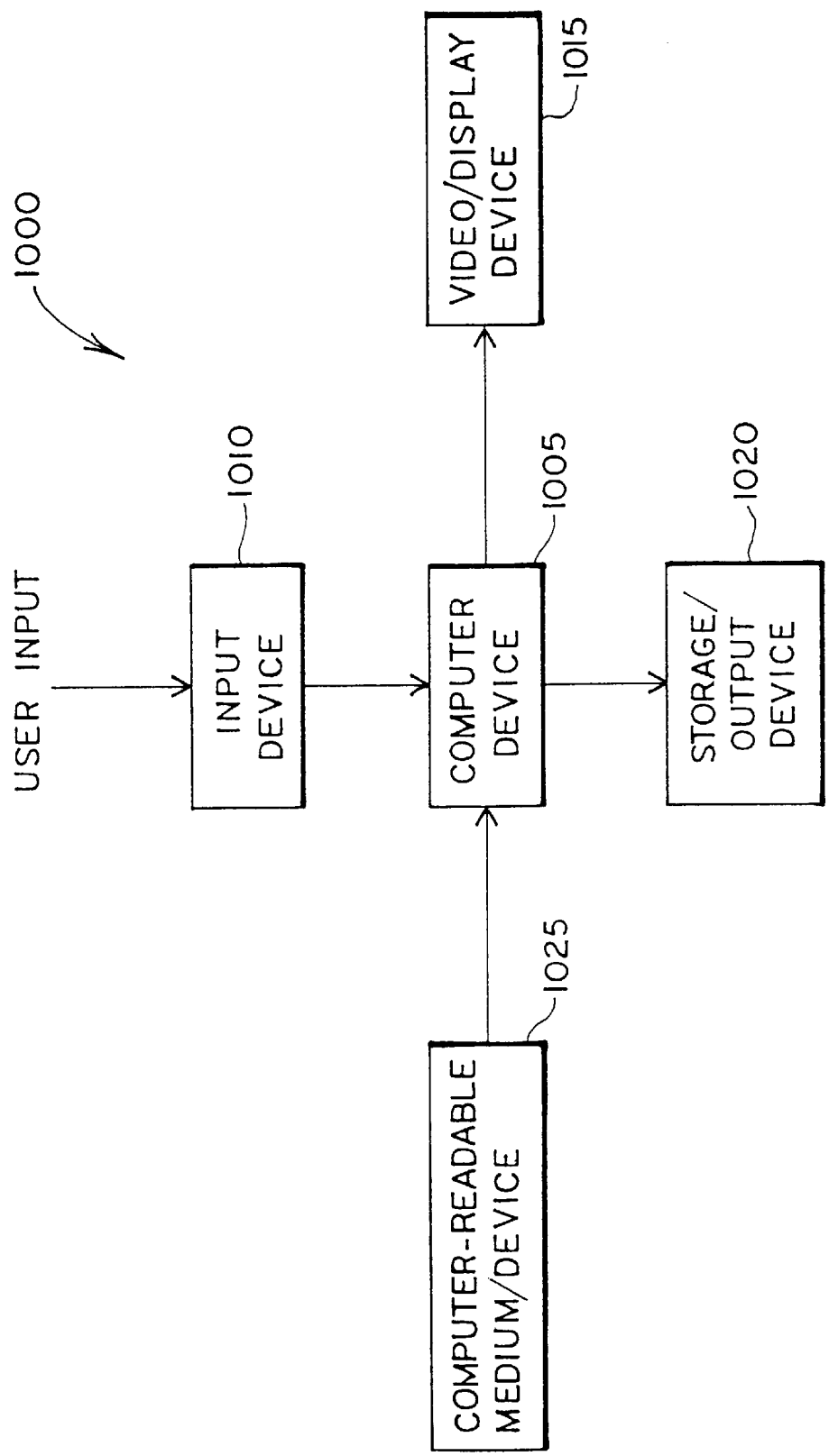
FIG. 1 illustrates a block diagram of a circuit-characterization system according to the invention.

This invention contemplates apparatus and methods for characterizing constraints of electronic circuits. More particularly, the invention relates to ways of characterizing independent as well as dependent constraints in electronic circuits.

The apparatus and methods according to the invention provide novel ways of constraint characterization for electronic circuits, which include dependent constraint characterization, optimized constraint characterization, and inter-dependent constraint characterization. The invention also contemplates degradation options for use in circuit characterization. The degradation options include unity slope, absolute-from-breakdown, and normalized intersection. The apparatus and methods according to this invention provide circuit designers with tools for improved circuit constraint characterization and, therefore, solve the problems of inaccurate or incomplete constraint characterization of electronic circuits.

Characterization of Electronic Circuits

Design and implementation of a modem electronic circuit typically involves characterization of the circuit. Generally, circuit or cell characterization refers to the process of determining a circuit's or cell's response to various external conditions. Put another way, characterization constitutes the acquisition of a set of measurements that predict how a real implementation (i.e., an implementation in actual hardware, for example, on an integrated circuit device) of the circuit will behave in response to a stimulus or stimuli. In a given design, for example, a circuit designed for implementation on an integrated circuit device, usually includes modules or cells. Each cell or module typically constitutes a circuit that includes a collection of circuit elements, for example, transistors, diodes, resistors, and the like. One may characterize the cells in a given design to determine various cell qualities or attributes, such as timing and power consumption.

As part of cell characterization, the characterization tool measures the responses of the cell or circuit at one or more characterization points and records those responses in the form of a characteristic equation or, alternatively, a characterization table. A characterization point refers to a specific voltage or current, temperature, and process for which the tool characterizes a cell or circuit. For a given characterization point, the tool typically measures a cell's response with respect to various input transition times and capacitive loads to determine the cell's behavior. A cell's behavior refers to the way the cell or circuit's output quantity (e.g. voltage) behaves as a function of its input stimulus or stimuli. For example, an AND gate behaves like a logical "and" operation. The behavior determines how a designer will use a cell or circuit, and what measurements a tool should take to predict how the cell or circuit will operate once physically implemented.

The type and amount of measurements a tool takes varies, usually driven by modeling considerations. The desired models for a cell or circuit determine what measurements a tool will take. Measurements may cover various quantities, for example, power and timing. Power measurements determine how much power a cell or circuit consumes as it operates. Power measurements may include leakage power, hidden power, and switching power, etc.

To generate timing models, the tool performs timing characterization of the cell or circuit. Similarly, to generate power models, the tool performs power characterization of the cell or circuit. Currently in the industry, the main model for cell characterization is Synopsys Incorporated's Liberty model. This model encompasses some aspects of timing and power. Other common models includes ALF, Verilog, VHDL, and VITAL. These models dictate what measurements the characterization tool should take and how it should acquire those measurements.

Timing measurements may include delay measurements and constraints. Delay measurements determine how fast a signal propagates through a cell or circuit, and the strength of the signal from the circuit's output or outputs. Constraint measurements include setup, hold, recovery, removal, minimum pulse-width, and non-critical minimum pulse-width, and the like. These types of measurements determine how close in time various transitions in the input signals may occur before a cell or circuit fails to operate predictably.

To perform timing characterization, tools typically measure three parameters for each input transition/capacitive load combination: intrinsic delay, output transition time, and input-pin capacitance. Intrinsic delay refers to the delay between the time of input transition and the time of the output transition, often measured between the 50% points of the waveforms that correspond to those quantities. Tools usually measure the output transition time across the most linear region of the output voltage waveform. Characterization tools typically measure transition times between the 10% and 90% or between 20% and 80% points of a voltage waveform.

The input-pin capacitance refers to the intrinsic effective capacitance of an input pin of a cell or circuit. Depending on the cell or circuit, the effective capacitance may vary as a function of the load that the cell drives, as output capacitance may couple back to the input leads or pins of the cell or circuit. The varying effective capacitance changes the amount of time it takes to charge and discharge the effective capacitance and, therefore, impacts the timing of the cell or circuit.

To characterize a given circuit design, one typically uses a computer system that processes information relating to that circuit. FIG. 1 shows a block diagram of a system 1000 for processing information according to the invention. The system 1000 includes a computer device 1005, an input device 1010, a video/display device 1015, and a storage/output device 1020, although one may include more than one of each of those devices, as desired. The computer device 1005 couples to the input device 1010, the video/display device 1015, and the storage/output device 1020. The system 1000 may include more that one computer device 1005, for example, a set of associated computer devices or systems, as desired.

The system 1000 operates in association with input from a user. The user input typically causes the system 1000 to perform specific desired information-processing tasks, including circuit characterization and/or circuit simulation. The system 1000 in part uses the computer device 1005 to perform those tasks. The computer device 1005 includes an information-processing circuitry, such as a central-processing unit (CPU), although one may use more than one CPU or information-processing circuitry, as persons skilled in the art would understand.

The input device 1010 receives input from the user and makes that input available to the computer device 1005 for processing. The user input may include data, instructions, or both, as desired. The input device 1010 may constitute an alphanumeric input device (e.g., a keyboard), a pointing device (e.g., a mouse, roller-ball, light pen, touch-sensitive apparatus, for example, a touch-sensitive display, or tablet), or both. The user operates the alphanumeric keyboard to provide text, such as ASCII characters, to the computer device 1005. Similarly, the user operates the pointing device to provide cursor position or control information to the computer device 1005.

The video/display device 1015 displays visual images to the user. The visual images may include information about the operation of the computer device 1005, such as graphs, pictures, images, and text. The video/display device may constitute a computer monitor or display, a projection device, and the like, as persons of ordinary skill in the art would understand. If a system uses a touch-sensitive display, the display may also operate to provide user input to the computer device 1005.

The storage/output device 1020 allows the computer device 1005 to store information for additional processing or later retrieval (e.g., softcopy), to present information in various forms (e.g., hardcopy), or both. As an example, the storage/output device 1020 may constitute a magnetic, optical, or magneto-optical drive capable of storing information on a desired medium and in a desired format. As another example, the storage/output device 1020 may constitute a printer, plotter, or other output device to generate printed or plotted expressions of the information from the computer device 1005.

The computer-readable medium 1025 interrelates structurally and functionally to the computer device 1005. The computer-readable medium 1025 stores, encodes, records, and/or embodies functional descriptive material. By way of illustration, the functional descriptive material may include computer programs, computer code, computer applications, and/or information structures (e.g., data structures or file systems). When stored, encoded, recorded, and/or embodied by the computer-readable medium 1025, the functional descriptive material imparts functionality. The functional descriptive material interrelates to the computer-readable medium 1025.

Information structures within the functional descriptive material define structural and functional interrelations between the information structures and the computer-readable medium 1025 and/or other aspects of the system 1000. These interrelations permit the realization of the information structures' functionality. Moreover, within such functional descriptive material, computer programs define structural and functional interrelations between the computer programs and the computer-readable medium 1025 and other aspects of the system 1000. These interrelations permit the realization of the computer programs' functionality.

By way of illustration, the computer device 1005 reads, accesses, or copies functional descriptive material into a computer memory (not shown explicitly in FIG. 1) of the computer device 1005. The computer device 1005 performs operations in response to the material present in the computer memory. The computer device 1005 may perform the operations of processing a computer application that causes the computer device 1005 to perform additional operations. Accordingly, the functional descriptive material exhibits a functional interrelation with the way the computer device 1005 executes processes and performs operations.

Furthermore, the computer-readable medium 1025 constitutes an apparatus from which the computer device 1005 may access computer information, programs, code, and/or applications. The computer device 1005 may process the information, programs, code, and/or applications that cause the computer device 1005 to perform additional operations.

Note that one may implement the computer-readable medium 1025 in a variety of ways, as persons of ordinary skill in the art would understand. For example, memory within the computer device 1005 may constitute a computer-readable medium 1025, as desired. Alternatively, the computer-readable medium 1025 may include a set of associated, interrelated, or networked computer-readable media, for example, when the computer device 1005 receives the functional descriptive material from a network of computer devices or information-processing systems. Note that the computer device 1005 may receive the functional descriptive material from the computer-readable medium 1025, the network, or both, as desired.

Characterization Process Flow

Figure 2:
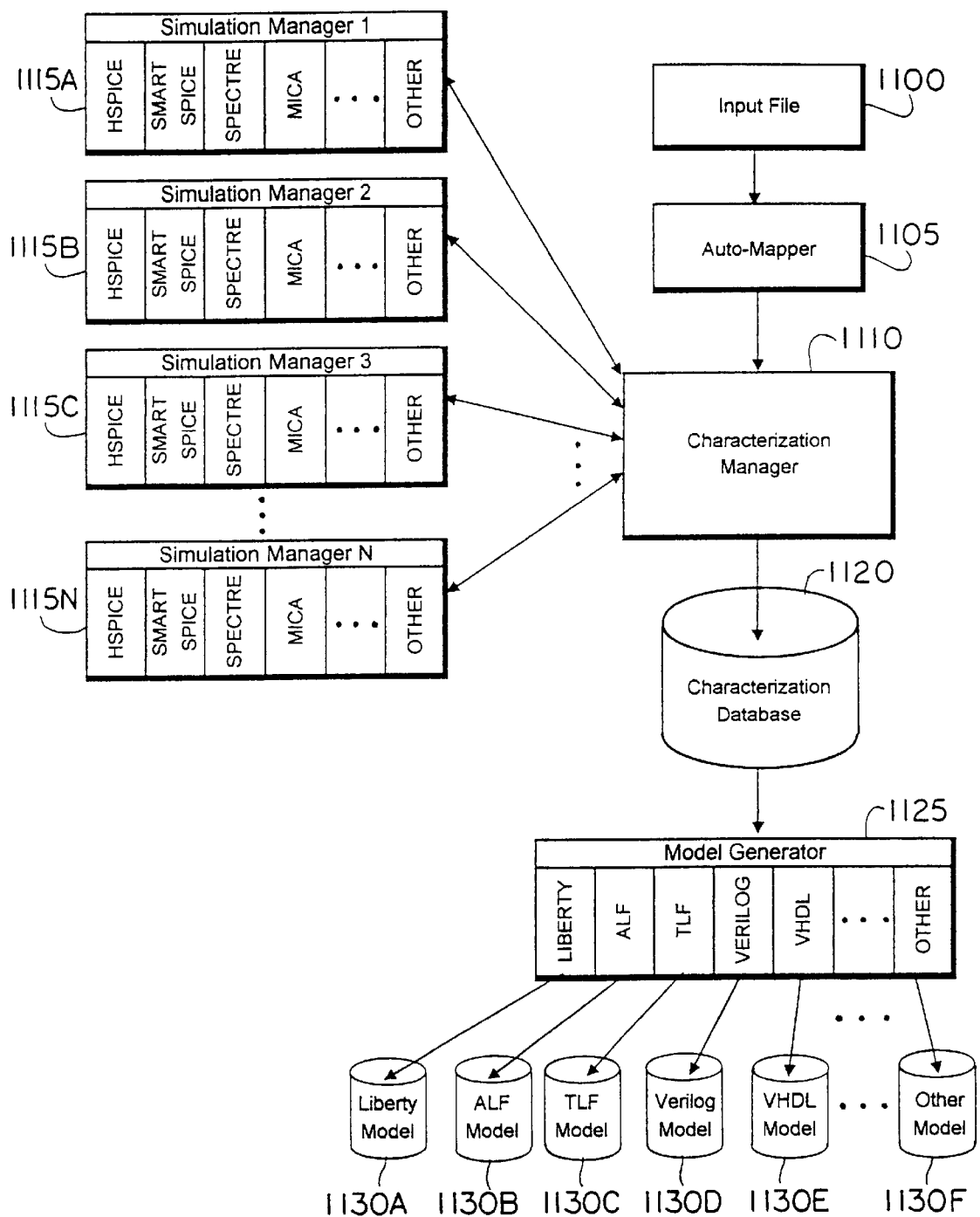
FIG. 2 shows a block diagram of a process flow for a circuit-characterization system according to the invention.

FIG. 2 shows a block diagram of the architectural process flow of a characterization tool that facilitates characterization of circuitry according to the invention. More specifically, one may use the characterization tool in FIG. 2 to characterize constraints, implement degradation options, and generally characterize circuit or cell attributes, such as power consumption and timing.

The process flow in FIG. 2 includes using an input file 1100, an auto-mapper 1105, a characterization manager 1110 and associated simulation managers 1115A–1115N, a characterization database 1120, a model generator 1125, and model databases 1130A–1130F. The characterization tool may run or execute on a computer, such as the computer device 1005 in FIG. 1, or on a set or network of associated computers, as persons skilled in the art who have read the description of the invention would understand.

The characterization tool receives its input via an input file 1100. The input file 1100 contains a functional or behavioral specification of the circuitry or cell that the user wishes to characterize. The input file 1100 may include, for example, the input and output leads or pins of a cell, the relationship between the input and output leads or pins of the cell, and the functional description of the cell, as desired.

Figure 3:
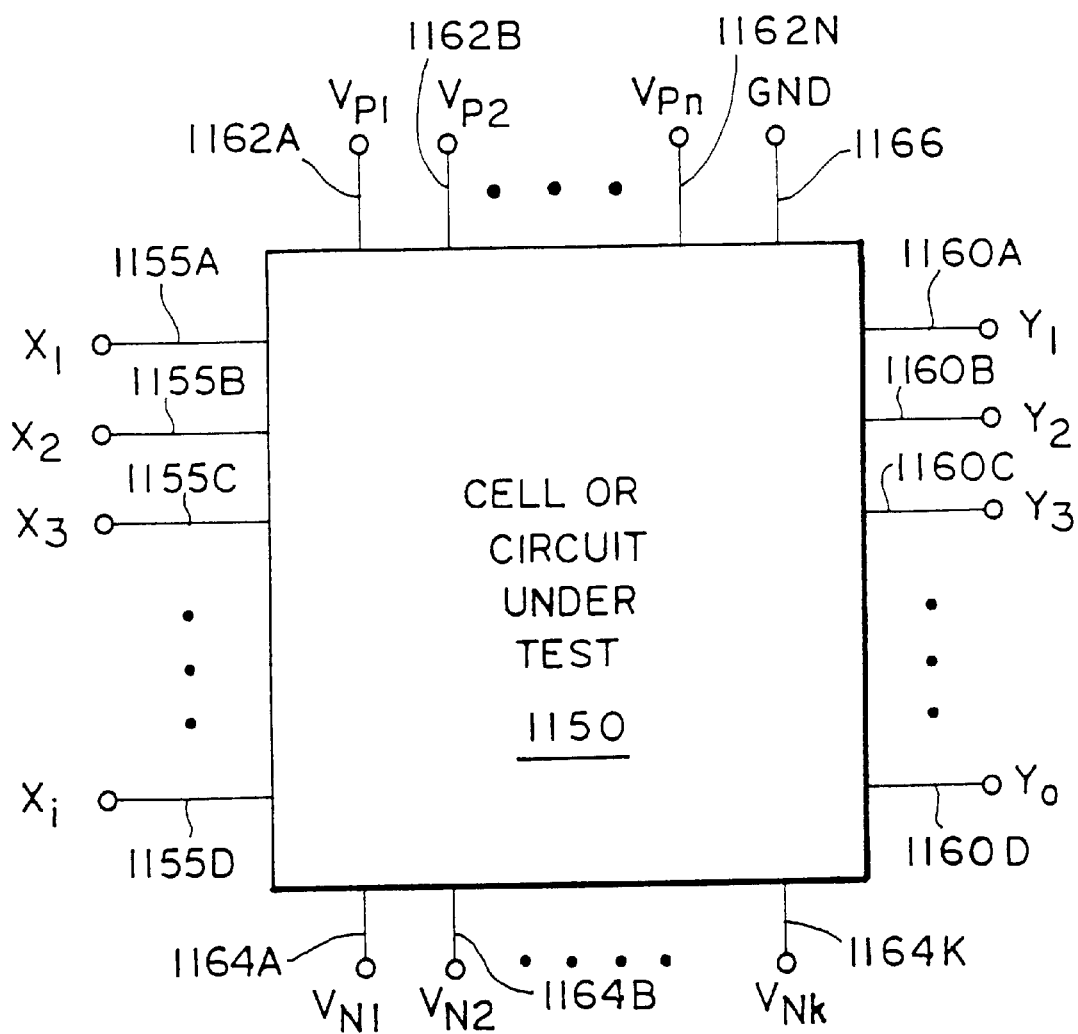
FIG. 3 illustrates a general block diagram of a cell or circuit under test by a circuit characterization system according to the invention.

FIG. 3 shows a general block diagram of a cell or circuit under test 1150. The circuit 1150 may receive power from one or more positive power supplies or sources 1162A–1162N and one or more negative power supplies or sources 1164A–1164K, as desired. The circuit 1150 may also have a signal and/or power ground 1166. Alternatively, the circuit 1150 may have separate signal and power ground connections (not shown explicitly in FIG. 3), as desired.

Furthermore, the circuit 1150 may have one or more inputs and one or more outputs. The exemplary circuit 1150 in FIG. 3 has a number of inputs, generally designated as input $X_1$ 1155A, input $X_2$ 1155B, input $X_3$ 1155C, . . . , and input $X_i$ 1155D. The circuit 1150 also has a number of outputs, generally designated as output $Y_1$ 1160A, output $Y_2$ 1160B, output $Y_3$ 1160C, . . . , and output $Y_o$ 1160D. Thus, the input file 1100 for circuit 1150 may describe the inputs $X_1$–$X_i$, the outputs $Y_1$–$Y_o$, the relationship between the inputs $X_1-X_i$ and the outputs $Y_1-Y_o$, and a functional description of the behavior of circuit 1150.

The input file 1100 may provide the functional description of the cell or circuit in a variety of formats. For example, the input file 1100 may include a functional description of a cell in the form of the cell's Boolean specifications. The Boolean specifications may describe combinational or sequential circuits, as desired. The Liberty (.lib) models generated according to specifications from Synopsys, Incorporated (a vendor of EDA tools), constitute an example of a Boolean input file 1100.

Alternatively, the input file 1100 may include a functional description in a description language, for example, Pilot. Silicon Metrics Corporation, the assignee of this invention, provides the specifications for Pilot. Among other capabilities, Pilot allows the user to define cell characterization methodologies, cell behavior, and modeling properties, as desired.

Referring to FIG. 2, an auto-mapper 1105 receives the information in the input file 1100. The auto-mapper 1105 defines how the tool characterizes the cell. The auto-mapper 1105 processes the cell information within the input file 1100 and determines an appropriate methodology for characterizing the cell (unless the input file 1100 specifies a particular characterization methodology). Characterization methodology for a cell generally takes into account the cell's boundary network, e.g., the structure of the load circuitry applied to the cell's output or outputs and the structure of the source circuitry applied to the cell's input or inputs. The auto-mapper 1105 specifies the structure of the stimuli to apply to the input or inputs of the cell as well which output or outputs of the cell to observe. In other words, the auto-mapper 1105 uses the information in the input file 1100 to generate specifications for simulating the cell's behavior (as described below in more detail).

The auto-mapper 1105 provides those specifications to the characterization manager 1110. The specifications include a list of arcs for the characterization manager 11110 and the associated simulation managers 1115A–1115N to use to simulate the cell. The auto-mapper 1105 can consider a variety of attributes, as desired. Those attributes include, for example, propagation delay of the cell, the slew rate of the cell's output, the cell's input capacitance, and power consumption by the cell.

Power consumption characteristics may include internal power, hidden power, switching power, and leakage power. Internal power refers to the consumption of power within a cell in response to a change of state on one or more inputs. Hidden power refers to certain cases of internal power. Hidden power concerns power consumption within a cell in response to a change of state on one or more inputs that causes no corresponding change of state on any of the cell's outputs. Switching power, also known as capacitive or output power, concerns the consumption of power to charge and discharge a load capacitance at an output of the cell. Leakage power, also known as static power, refers to power consumption in a cell even when no inputs or outputs of the cell change state. Leakage power arises from deviations of actual circuitry from its ideal behavior. Leakage power typically results from sub-threshold leakage and current flow through reverse-biased junctions between diffusion regions and the substrate in an integrated circuit device.

The auto-mapper 1105 provides the list of arcs by examining the cell's behavioral description. For combinational circuits, the auto-mapper 1105 may use an expression or equation that describes the cell's behavior (e.g., the Boolean expression for the cell) or the cell's truth table. For sequential circuits, the auto-mapper 1105 may use a cell's state table or an expression or set of expressions of the information that the state table contains. Using that information, the auto-mapper 1105 determines what changes in the state of an input or group of inputs of the cell propagate to an output or outputs of the cell and/or to an internal node or nodes of the cell. The auto-mapper 1105 determines the arcs that facilitate the characterization of various properties or constraints of a cell, for example, setup time, hold time, hidden power, switching power, minimum pulse-width of the clock signal, and the like.

Once it has determined the set of arcs, the auto-mapper 1105 specifies to the characterization manager 1110 the structure of the stimulus or stimuli that the characterization manager 1110 and the simulation managers 1115A–1115N use to simulate the cell's behavior. For example, the auto-mapper 1105 specifies the structure of the state transitions of the stimuli waveforms to apply to the cell in order to measure the cell's desired characteristics. The auto-mapper 1105 also selects a set of measurements of the various attributes of the cell (e.g., output voltage) that characterize the cell's behavior, and specifies the set of measurements to the characterization manager 1110.

Note that, rather than relying on the auto-mapper 1105 to provide a characterization methodology, the user may explicitly specify the methodology, as desired. The user may do so, for example, by using the Pilot language, as described above. In other words, the user may provide via Pilot a characterization methodology that overrides the characterization methodology that auto-mapper 1105 would have selected if the user had not chosen to specify a particular characterization methodology.

The characterization manager 1110 uses the information it receives from the auto-mapper 1105 to generate input files (not shown explicitly in FIG. 2) for the set of simulation managers 1115A–1115N. The input files constitute circuit representations of the circuit-under test or cell-under-test (CUT). The input files include descriptions of the components or devices within the cell, the cell's topology (i.e., the connections or couplings among the components or devices), the input stimuli, the types of simulation to perform and the parameters for those simulations, and the output or outputs to observe. In an exemplary embodiment of the invention, for each cell in a given circuit, a copy of the characterization manager 1110 runs on a computer device, such as computer device 1005 in FIG. 1. One, however, may use other arrangements for running the characterization manager 1110, as desired.

To achieve increased utility and flexibility, in exemplary embodiments the characterization manager 1110 provides the input files for a variety of simulators (used within the simulation managers 1115A–1115N) from a multitude of vendors. For example, the characterization manager 1110 may provide input files, sometimes referred to as "SPICE decks" or netlists, suitable for use with various simulators, for example, HSPICE, SmartSpice, Spectre, MICA, and the like. "SPICE" constitutes an acronym for Simulation Program with Integrated Circuit Emphasis, and refers to the generic version of a commonly used simulator familiar to persons of ordinary skill in the art. HSPICE (from Avant! Corp.), SmartSpice (from Silvaco International), Spectre (from Cadence Design Systems, Inc.), and MICA (from Motorola, Inc.) refer to particular simulators. Note that, with modifications within the knowledge of persons of ordinary skill in the art, the characterization manager 1110 can generally provide input files for virtually any given simulators, as desired. The simulation managers 1115A–1115N use the input files they receive from the characterization manager 1110 to simulate the behavior of the circuit using a given simulator, for example, SPICE, HSPICE, SmartSpice, Spectre, MICA, and the like.

The characterization manager 1110 employs a variety of techniques that tend to reduce the time and resources used during circuit characterization. Using those techniques, the characterization manager 1110 provides input files for the desired simulator or simulators. More specifically, the characterization manager 1110 employs a technique called auto-ranging to specify the range of values for the input stimulus or stimuli. The characterization manager 1110 specifies the range of values to the simulation managers 1115A–1115N.

The simulation managers 1115A–1115N use the range of values to simulate the behavior of the CUT and to generate response surfaces for the CUT. The response surfaces provide information about one parameter (e.g., delay through the CUT) as a function of other parameters (e.g., input transition delay and capacitive load). Commonly assigned U.S. patent application Ser. No. 09/090,457, titled "Method and System for Creating Electronic Circuitry," and filed on Jun. 4, 1998, provides more details regarding the auto-ranging technique.

In exemplary embodiments of the invention, for each CUT, a separate copy of the characterization manager 1110 runs on one of an appropriate number, M, of coupled computer devices (such as computer device 1005 in FIG. 1). The number M constitute an integer equal to or greater than unity. Each of the characterization managers 1110 is responsible for the characterization of one of the CUTs. In other words, a library of cells that contains M cells causes the initiation of M characterization managers 1110. Note, however, that one may use other arrangements, for example, a single computer device, as desired. The choice of the number and configuration of the computer devices, as well as the structure and operation of the couplings among those computer devices (e.g., a network) depends on a number of considerations specific to each implementation, as persons of ordinary skill in the art would understand.

To characterize a CUT, in exemplary embodiments each characterization manager 1110 spawns or runs a set of N processes, where N constitutes an integer equal to or greater than unity. Each of the N processes corresponds to one of the simulation managers 1115A–1115N. Note, however, that one may use other arrangements for the simulation managers 1115A–1115N, depending on various factors (e.g., the speed, traffic level, and implementation of the coupling among the computer devices as well as the number of the computer devices), as persons of ordinary skill in the art would understand. Each of the simulation managers 1115A–1115N performs a simulation on the CUT using an input file that the characterization manager 1110 provides, as described above. Each of the simulation managers 1115A–1115N provides the results of the simulation to the characterization manager 1110.

Once it receives the simulation results from the simulation managers 1115A–1115N, each characterization manager 1110 determines the response surface or surfaces of the corresponding CUT. The characterization manager 1110 does so by causing the simulation managers 1115A–1115N to take a sufficiently large number of measurements of the CUT's simulated characteristics to represent the response with a desired degree of accuracy. In other words, the characterization manager 1110 uses a technique called over-sampling to determine the points that tend to increase the accuracy of the representation of the response surfaces of the CUT. For more details regarding the over-sampling technique, see U.S. patent application Ser. No. 09/090,457, cited and discussed above.

The characterization manager 1110 processes the results of the simulations that the simulation managers 1115A–1115N perform and makes the results available in a characterization database 1120. Thus, the characterization database 1120 includes characterization results for the cells in the design. A model generator 1125 uses the data residing within the characterization database 1120 to generate models (e.g., timing or power models) for the cells within the circuit. The models that the model generator 1125 produces serve as input files to simulation engines or simulators (not shown explicitly in FIG. 2).

The model generator 1125 may use properties that relate to the characteristics of the cells. The user may specify those properties in the input file 1100, as desired. The model generator 1125 may also use a technique known as data reduction to reduce the amount of data that represent the characteristics of the CUTs, as desired. The data-reduction technique allows the model generator to reduce the size of tables that represent the response surfaces of the CUTs.

For more details regarding the data-reduction technique, see U.S. patent application Ser. No. 09/090,457, cited and discussed above.

To provide the tool with increased utility and flexibility, in exemplary embodiments of the invention the model generator 1125 generates models, such as timing or power models, in a variety of formats. For example, the model generator can generate models in the following formats: Liberty (from Synopsys, Incorporated), Advanced Library Format or ALF (from Nippon Electric Corporation), Timing Library Format or TLF (from Cadence Design Systems, Inc.), Verilog (also from Cadence Design Systems, Inc.), and/or Very High-Speed Integrated Circuit (VHSIC) Hardware Description Language or VHDL. The model generator 1125 may generate models for other simulators or simulation engines, as persons of ordinary skill in the art who have read the description of the invention would understand.

Moreover, the model generator 1125 may generate models in a parallel fashion, as desired. In other words, several instances of the model generator 1125 may run on a number of associated computer devices to generate the model databases 1130A–1130F. In such an implementation, each instance of the model generator 1125 receives the data within the characterization database 1120 and uses those data to generate a model or models for desired simulation engine or engines. The model generator 1125 stores the resulting models in model databases, as described above. The choice of the particular implementation of the model generator or generators 1125 depends on a number of considerations (e.g., amount and type of computing and networking resources, the complexity of the design, and the like), as persons of ordinary skill in the art understand.

The model generator 1125 provides the desired models in model databases 1130A–1130F. Note that the characterization tool can provide support for a variety of simulators, as desired. The model generator 1125 may provide models for additional simulators to other model databases, as denoted by model database 1130F in FIG. 2. A simulator may subsequently use a model from the appropriate model database to perform simulation of part or all of the circuit that ;0 contains the CUTs. From the results of the simulation run or runs, the user may obtain a desired characterization of the circuit.

The characterization tool may also perform checks to determine the relative accuracy of the results of the simulators. In other words, the tool may receive the results of the simulations from the simulators and compare those results to the results stored in the characterization database 1120. The comparison of the results allows the tool to gauge the accuracy of the models compared to the circuit-level models (e.g., SPICE models) that the simulation managers 1115A–1115N use.

Constraint Characterization

As noted above, one may use the tool described in connection with FIG. 2 to perform a variety of circuit characterizations. One type of circuit or cell characterization involves constraints. A circuit constraint refers to a limit imposed on an environmental condition, a stimulus, or stimuli of the circuit to provide for proper operation of the circuit. Put another way, a circuit constraint constitutes a specification or limit on a pin or lead of the circuit or cell (typically an input pin or lead) that should be true for the behavior of the cell to be valid. Various constraints include setup time, hold time, recovery, removal, minimum pulse-width, non-critical minimum pulse-width, etc.

Traditionally, the limits have been set at or before the moment of functional failure (also known as the breakdown point or the pass-fail point) of a circuit. Observing the behavior of a constraint, however, demonstrates that operating within a circuit's functional tolerances does not necessarily mean that the circuit operates in a predictable manner. In other words, the designer may trade circuit performance for predictability of the operation of the circuit.

Figure 4:
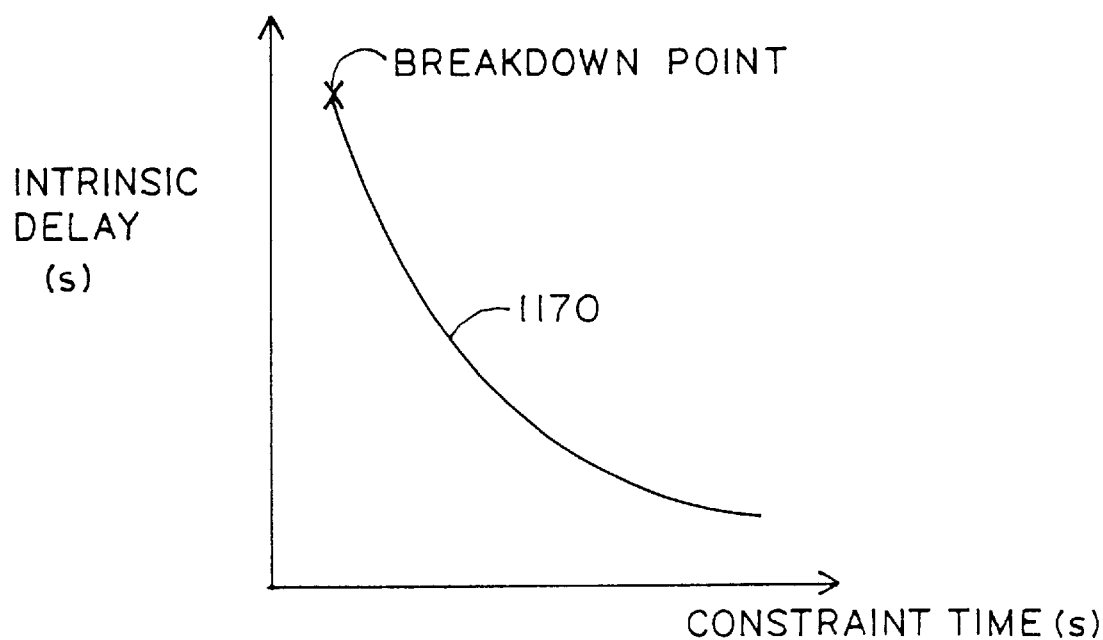
FIG. 4 shows a plot of an intrinsic delay of a circuit as a function of a constraint time of the circuit.

Circuit attributes often behave non-linearly as a function of various constraints of the circuit. For example, consider the intrinsic delay of a sequential circuit, such as a latch. FIG. 4 shows a curve 1170 that plots the intrinsic delay of the latch as a function of constraint time (the constraint may constitute, for example, the setup time or hold time of the latch). Note that the intrinsic delay of the circuit increases non-linearly as a function of decreasing constraint time. When the constraint time decreases beyond a certain limit, the intrinsic delay of the circuit reaches the breakdown point. At the breakdown point, the circuit fails to operate correctly or as desired.

Figure 5:
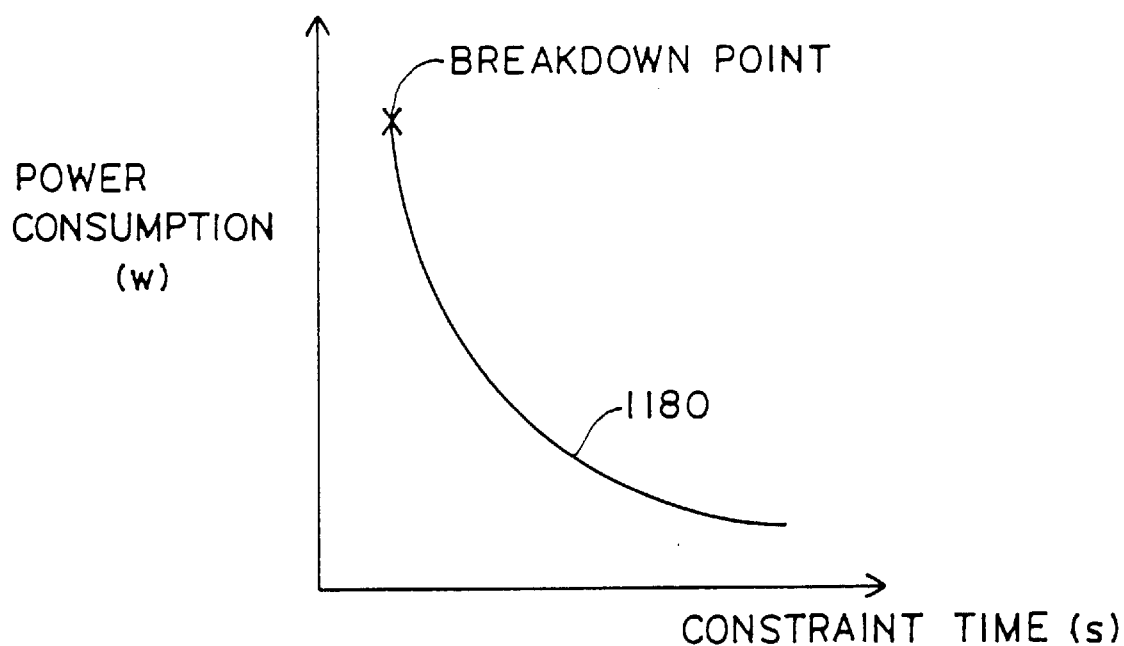
FIG. 5 depicts a plot of power consumption by a circuit as a function of a constraint time of the circuit.

FIG. 5 shows a curve 1180 that plots the power consumption within the latch as a function of constraint time (again, the constraint may constitute, for example, the setup time or hold time of the latch). Similar to the intrinsic delay, the power consumption of the circuit increases non-linearly as a function of decreasing constraint time. When the constraint time decreases beyond a certain limit, power consumption within the circuit reaches the breakdown point, where it fails to operate in a correct or desired manner.

Circuit constraints govern the behavior of both combinational and sequential circuits. As an example, consider the CMOS two-input NAND gate 1190 shown in FIG. 6A. The NAND gate 1190 includes p-type MOS transistors 1193A and 1193B, as well as n-type MOS transistors 1196A and 1196B. The NAND gate 1190 has two inputs, A and B, and one output, Y. FIG. 6B shows the truth table of the NAND gate 1190.

Suppose that the NAND gate 1190 inputs, A and B, make a transition from A=0 and B=0 to A=1 and B=1. When A=0 and B=0, transistors 1193A and 1193B are on, thus pulling the output Y high toward the supply voltage, $V_{DD}$. Also, the low voltages on inputs A and B keep transistors 1196A and 1196B off, thus substantially insulating the output Y from the ground voltage, $V_{SS}$. When A=1 and B=1, however, the reverse situation occurs: transistors 1193A and 1193B turn off, and transistors 1196A and 1196B turn on. The turning on of transistors 1196A and 1196B pulls the output Y low toward the ground voltage, $V_{SS}$. Also, the high voltages on inputs A and B keep transistors 1193A and 1193B off, thus substantially insulating the output Y from the supply voltage, $V_{DD}$.

The intrinsic delay of NAND gate 1190 depends, among other things, on the relative points in time when the A and B inputs make their respective low-to-high transitions. The point in time when one input makes a transition relative to a transition on the other input constitutes a constraint of the NAND gate 1190. FIG. 6C shows a situation where input A makes its transition from low to high and, within a sufficiently long time, input B makes its low-to-high transition. (In other words, the transitions on the inputs of the NAND gate 1190 do not violate the input-transition constraint). As the plot of the voltage at output Y shows, the output of the NAND gate 1190 makes a high-to-low transition within a nominal amount of time.

Now consider the situation in FIG. 6D. Here, the inputs A and B make their low-to-high transitions almost simultaneously relative to each other. Referring to FIG. 6A, the near-simultaneous low-to-high transitions on inputs A and B cause transistors 1193A and 1193B to begin to turn off. The transitions on the inputs also cause transistors 1196A and 1196B to begin to turn on. Because of the simultaneous turning off of the p-network (i.e., transistors 1193A and 1193B) and the turning on of the n-network (i.e., transistors 1196A and 1196B), the NAND gate 1190 takes a longer time to resolve its output Y. In other words, a violation of the input-transition constraint occurs. Consequently, as the plot in FIG. 6D of the voltage at the output Y shows, the high-to-low transition of output Y takes a longer time compared to its high-to-low transition in FIG. 6C.

As another example, consider inverter 1200 in FIG. 7A. The inverter 1200 includes p-type MOS transistor 1203 and n-type MOS transistor 1206. The inverter 1200 has one input, A, and one output, Y. FIG. 7B shows the truth table of the inverter 1200.

Suppose that the inverter 1200 input A make a transition from low to high and, some time later, makes a second transition from high to low. Initially, when A=0, transistor 1203 is on, thus pulling the output Y high toward the supply voltage, $V_{DD}$. Also, the low voltage on input A keeps transistor 1206 off, thus substantially insulating the output Y from the ground voltage, $V_{SS}$. When A makes its transition to high, however, the reverse situation occurs: transistor 1203 turns off, and transistor 1206 turns on. The turning on of transistor 1206 pulls the output Y low toward the ground voltage, $V_{SS}$. Also, the high voltage on input A keeps transistor 1203 off, thus substantially insulating the output Y from the supply voltage, $V_{DD}$. Finally, when some time later the input A makes its high-to-low transition, transistor 1203 turns on and transistor 1206 turns off. Consequently, the voltage at the output Y rises toward the supply voltage, $V_{DD}$.

The intrinsic delay of inverter 1200 depends, among other things, on the pulse-width of the low-to-high-to-low transition applied to input A. In other words, the width of the voltage pulse applied to input A constitutes a constraint of the inverter 1200. FIG. 7C shows a situation where the pulse applied to input A has a sufficiently wide duration. Put another way, the low-to-high and the high-to-low transitions on input A take place sufficiently apart in time. As the plot of the voltage at output Y shows, the output of the inverter 1200 makes a high-to-low transition followed by a low-tohigh transition within a nominal amount of time (the amount of time corresponds to the nominal intrinsic delay of the inverter 1200).

FIG. 7D shows the situation where the high-to-low transition on input A follows the low-to-high transition on input A almost instantaneously. Referring to FIG. 7A, the near-instantaneous high-to-low transition following the low-to-high transition on input A causes transistor 1203 to begin to turn off and then almost immediately begin to turn on again. Similarly, transistor 1206 begins to turn on and then almost immediately begins to turn off again. As a result, the pulse on the input A does not propagate to the output Y. Referring to the plot of the voltage at output Y. the low-to-high-to-low transition on input A does not result in a corresponding set of transitions on output Y. Because of the violation of the minimum pulse-width constraint on input A, output Y fails to make any predictable transitions that correspond to the transitions on input A.

Figure 8A:
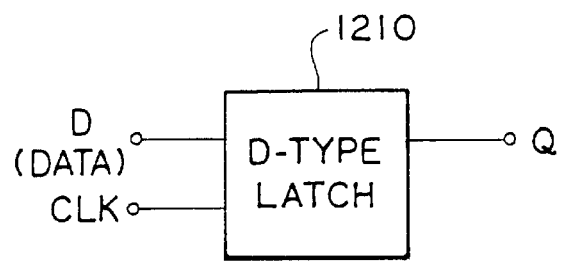
FIG. 8A depicts a block diagram of a D-type latch.
Figure 8B:
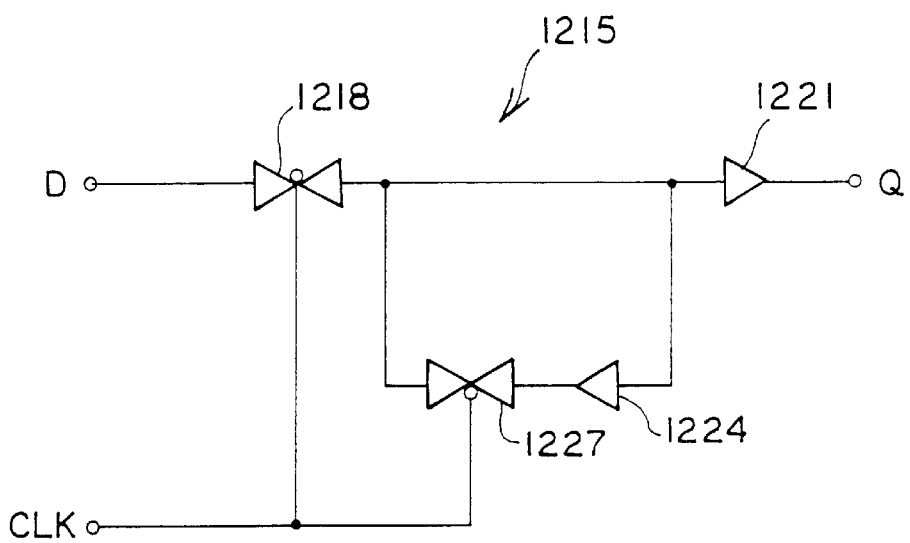
FIG. 8B illustrates an exemplary circuit diagram for the D-type latch of FIG. 8A.

Examples of sequential circuits that have constraints include D-type latches and D-type flip-flops. FIG. 8A shows a block diagram of a D-type latch 1210. The latch 1210 has a D (data) input, a clock input (labeled CLK), and a Q output. (Note that the latch 1210 may also have a $\overline{Q}$ output, which FIG. 8A does not depict.) FIG. 8B shows an exemplary, simplified schematic diagram 1215 of latch 1210. The latch 1210 includes pass gates 1218 and 1227, and buffers 1221 and 1224.

When the clock input is high, pass gate 1218 conducts, but pass gate 1227 does not. As a result, the output Q reflects the signal applied to input D. If input D makes any transitions while the clock CLK input is high, output Q reflects those transitions. (Note that with simple modifications, one may implement a latch in which the output Q reflects input transitions when the clock signal is low, rather than high, as persons of ordinary skill in the art would understand. Also note that, for the sake of simplicity, the circuit diagram 1215 in FIG. 8B does not show buffering of the various signals, i.e., data and clock signals. The buffering of those signals may have implications for the constraints of the latch, as described below.)

Conversely, when the clock signal is low, pass gate 1218 does not conduct, but pass gate 1227 does. Thus, pass gate 1218 blocks any transitions on input D from reaching the output Q. Conduction by pass gate 1227 completes a feedback loop that includes buffer 1224. As a result, the output Q retains the value that it had just before the clock made its high-to-low transition. In other words, the latch 1210 has memory and can retain its previous output value.

Figure 8C:
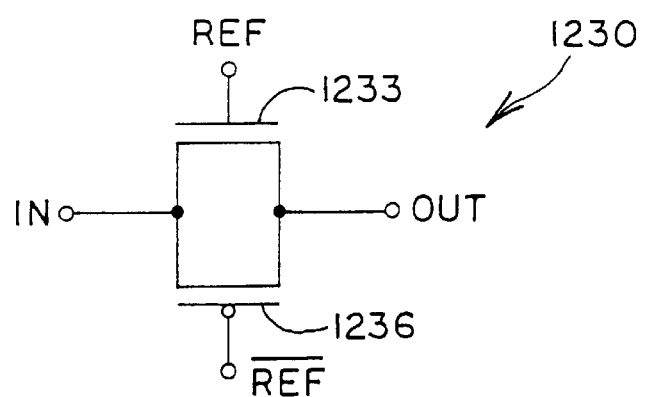
FIG. 8C shows a circuit diagram of a transmission gate used in the D-type latch of FIG. 8B.

FIG. 8C shows an exemplary schematic diagram for a pass gate 1230 that one may use as each of pass gates 1218 and 1227. The pass gate 1230 includes an n-type MOS transistor 1233 and a p-type MOS transistor 1236. An input signal REF drives the gate of transistor 1233. The complement of signal REF, $\overline{\text{REF}}$, drives the gate of transistor 1236. When REF is high, transistors 1233 and 1236 conduct and connect the input IN to the output OUT. Conversely, when REF is low, both transistors 1233 and 1236 are off, thus substantially isolating the input IN from output OUT.

Figure 9A:
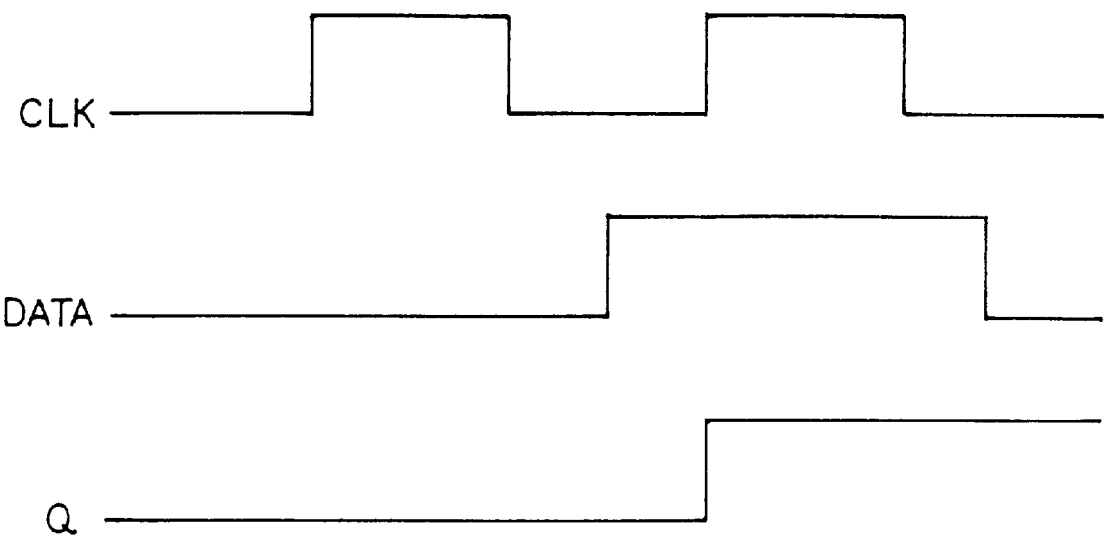
FIG. 9A depicts a set of waveforms that correspond to an operation of the D-type latch of FIG. 8A.
Figure 9B:
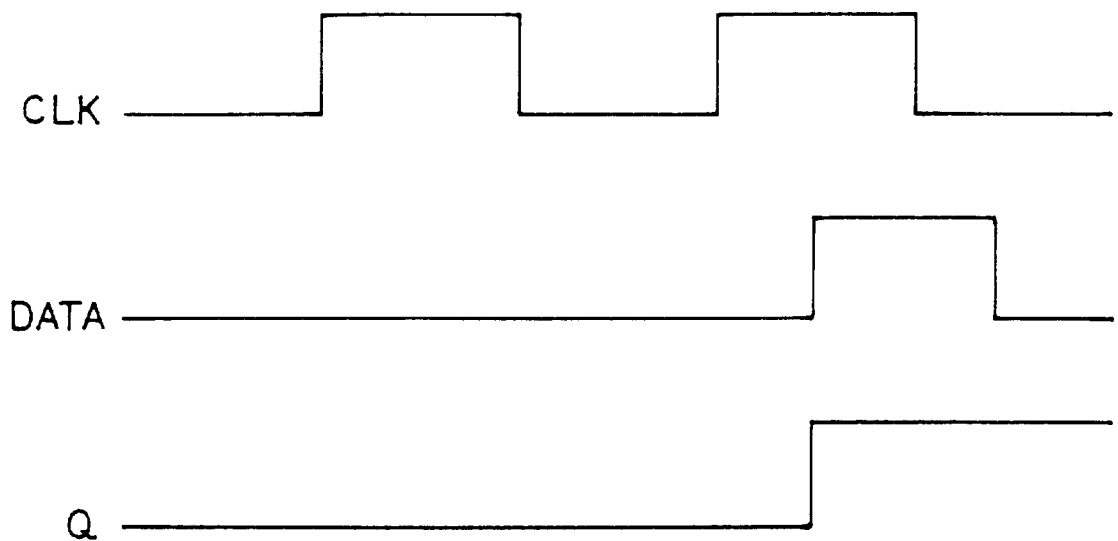
FIG. 9B illustrates another set of waveforms that correspond to an operation of the D-type latch of FIG. 8A.

FIGS. 9A and 9B show exemplary waveforms that correspond to the operation of latch 1210. FIG. 9A shows a situation where the D (data) input makes a low-to-high transition while the clock signal is low. Because the clock signal is low, the latch 1210 does not transmit the transition on the input D to the output Q. When the clock signal goes high, however, the latch 1210 transmits the high value on the input D to the output Q. Note that the input D subsequently makes a high-to-low transition. Because that transition occurs while the clock input is low, however, the latch 1210 does not transmit the transition to the output Q. Thus, the output Q retains the value it had just before the clock signal made its high-to-low transition.

In contrast, FIG. 9B illustrates a situation where the D input makes a low-to-high transition while the clock signal is high. Because the clock signal is high, the latch 1210 transmits the transition on the input D to the output Q. Thus, the output Q follows the transitions on input D while the clock signal is high. Note that, similar to FIG. 9A, the input D subsequently makes a high-to-low transition. Because that transition occurs while the clock input is low, however, the latch 1210 does not transmit the transition to the output Q. Hence, the output Q retains the value it had just before the clock signal made its high-to-low transition, in the same manner as in FIG. 9A.

Figure 10A:
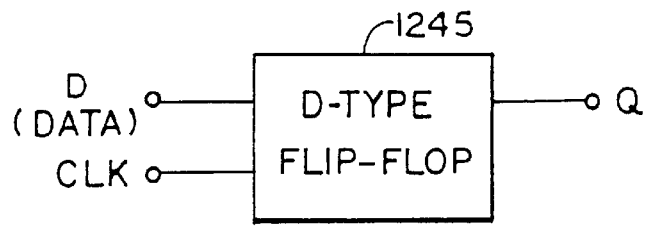
FIG. 10A depicts a block diagram of a D-type flip-flop.

FIG. 10A shows a block diagram of a D-type edge-triggered flip-flop 1245. Similar to the latch 1210 in FIG. 8A, the flip-flop 1245 has a D (data) input, a clock input (labeled CLK), and a Q output. (Note that the flip-flop 1245 may also have a $\overline{Q}$ output, which FIG. 10A does not show.) Unlike the latch 1210 in FIG. 8A, the flip-flop 1245 transmits the value at its D input to its Q output only when the clock makes a transition. An edge-triggered flip-flop does not transmit to the Q output those transitions on the D input that fail to persist until the clock signal makes a transition. Broadly speaking, two types of edge-triggered flip-flops exist: positive-edge-triggered flip-flops and negative-edge-triggered flip-flops. The two types of edge-triggered flip-flop differ by which clock transition transmits the value at the D input to the Q output. In a positive-edge-triggered flip-flop the D-to-Q transmission occurs when the clock makes a low-to-high transition; the converse occurs in a negative-edge-triggered flip-flop.

Figure 10B:
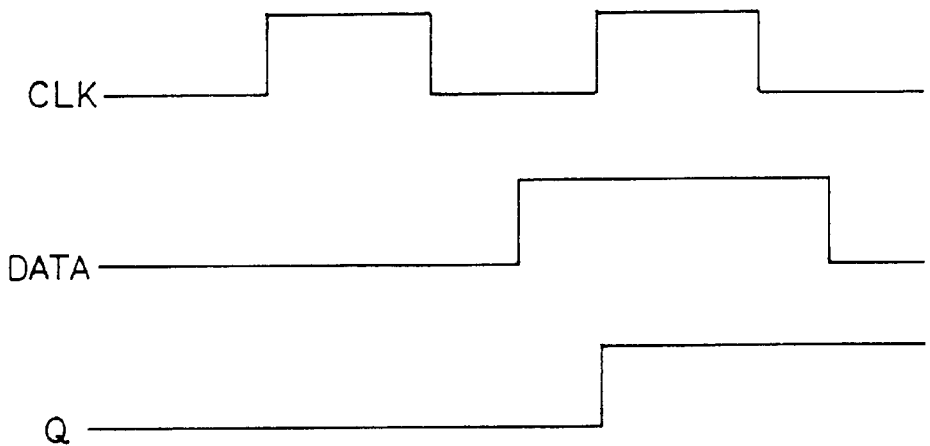
FIG. 10B shows a set of waveforms that correspond to an operation of the D-type flip-flop of FIG. 10A.
Figure 10C:
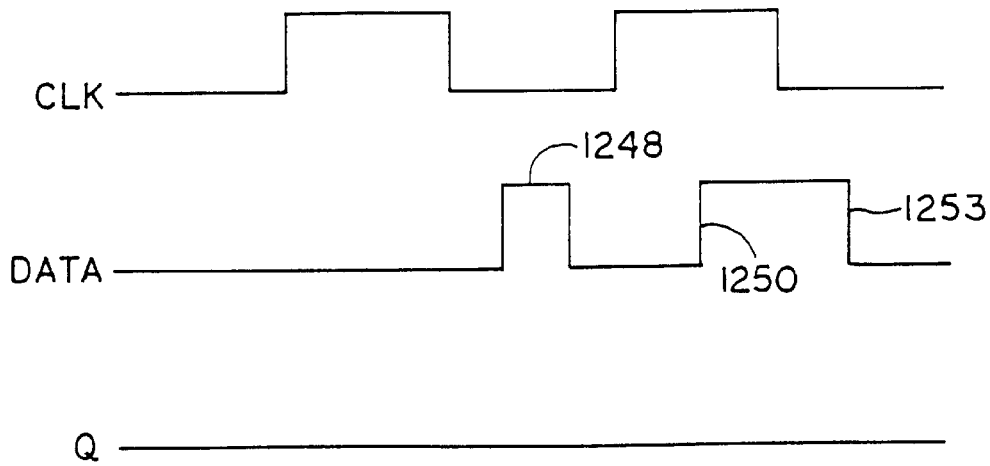
FIG. 10C depicts another set of waveforms that correspond to an operation of the D-type flip-flop of FIG. 10A.

FIGS. 10B and 10C show exemplary waveforms that correspond to the operation of a positive edge-triggered flip-flop. FIG. 10B shows a situation where the D (data) input makes a low-to-high transition while the clock signal is low. Because the clock signal is low and not making a transition from low to high, the flip-flop does not transmit the transition on the input D to the output Q at the moment that the transition on the D input occurs. When the clock signal subsequently makes a low-to-high transition, the flip-flop transmits the high value on the D input to the Q output. Note that the input D subsequently makes a high-to-low transition. Because that transition occurs while the clock input is low and not making a transition from low to high, the flip-flop does not transmit the transition to the output Q. Thus, the output Q retains the high value it held.

FIG. 10C illustrates a situation where the D input makes a low-to-high transition followed shortly by a high-to-low transition (shown as pulse 1248 in FIG. 10C) while the clock signal is low. Because the clock signal is low and not making a transition, the flip-flop does not transmit the transitions on the input D to the output Q. In effect, the flip-flop ignores the pulse 1248 on input D. The input D subsequently makes a low-to-high transition 1250. Because that transition occurs while the clock input is high, however, the flip-flop does not transmit the transition to the output Q. Later, the input D makes a high-to-low transition 1253. Again, because the transition occurs while the clock is low, the flip-flop does not transmit it to the output Q. In effect, the flip-flop ignores the pulse that consists of transitions 1250 and 1253.

Figure 11:
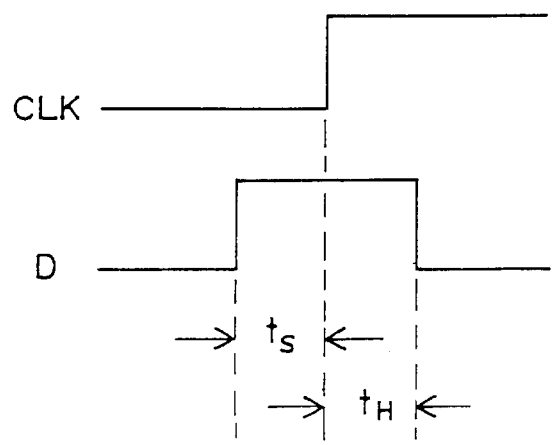
FIG. 11 illustrates an exemplary set of waveforms that show setup time and hold time for a storage circuit.

Two constraints one commonly encounters in sequential circuit design constitute setup time and hold time. Setup time and hold time are constraints that pertain in particular to latches and flip-flops. Setup time refers to the time interval between when one sets a state on the data input before a clock transition occurs that results in the state's propagation to the output (e.g., the Q output). Hold time refers to the amount of time after the clock transition that one should hold the changed state on the data input in order to preserve that state on the output. Stated differently, violating setup time results in the failure of the new state on the input to propagate to the output, whereas violating the hold time causes the new state to not persist on the output. FIG. 11 shows setup time, $t_S$, and hold time, $t_H$, with respect to a reference clock transition. Note from FIG. 11 that one measures setup and hold time with respect to the clock transition to which the setup and hold times pertain, i.e., the reference clock transition.

Figure 12:
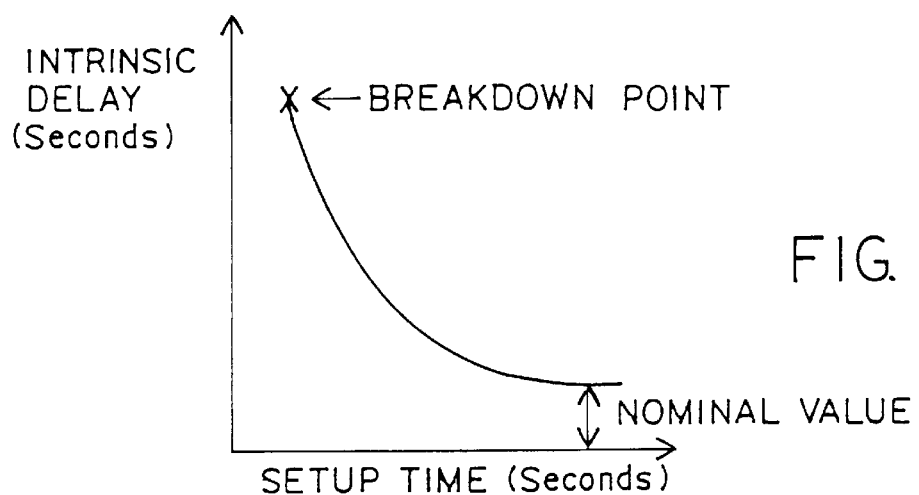
FIG. 12 shows an example of intrinsic delay of a storage circuit as a function of its setup time.

Like other constraints generally, setup and hold behave in a non-linear fashion. As an example, FIG. 12 shows the intrinsic delay of a latch or flip-flop as a function of setup time. Note that the intrinsic delay increases sharply from a nominal value as the setup time decreases below a certain point. The increase in intrinsic delay results from contention among the various circuit elements within the latch or flip-flop. For example, referring to FIG. 8B, pass gates 1218 and 1227 contend with each other as they each drive, and attempt to set, the input voltage to buffers 1221 and 1224. Resolving the contention among the circuit elements takes longer as setup time decreases with respect to the reference clock edge, thus giving rise to a higher intrinsic delay. At the limit, the latch or flip-flop reaches its breakdown point and an input transition fails to propagate to the output in a predictable manner.

Figure 13:
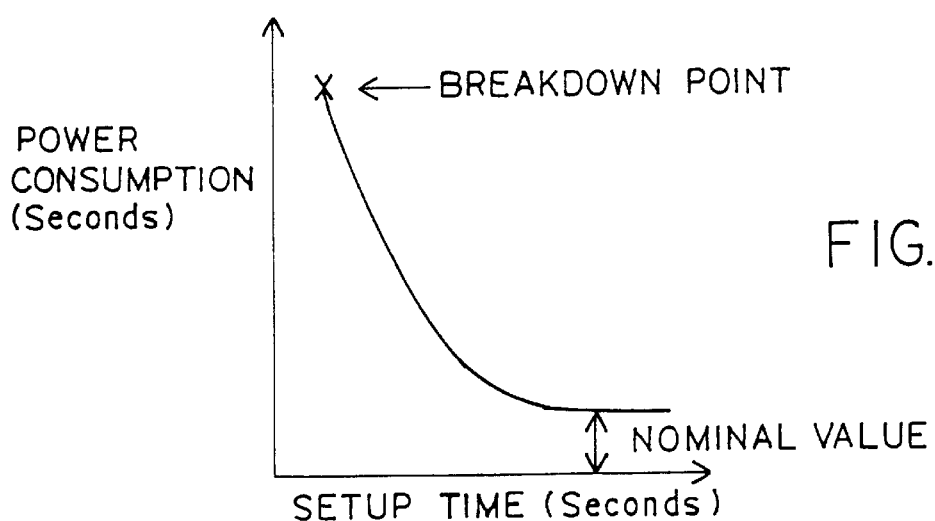
FIG. 13 depicts an example of power consumption of a storage circuit as a function of its setup time.

As another example of the non-linear behavior of the setup and hold constraints, FIG. 13 illustrates the power consumed within a latch or flip-flop as a function of setup time. Note that, similar to intrinsic delay, power consumption increases sharply as the setup time decreases below a certain point from its nominal value. Referring again to FIG. 8B, pass gates 1218 and 1227 contend with each other as they each drive, and attempt to set, the input voltage to buffers 1221 and 1224. The contention between pass gates 1218 and 1227 results in increased power consumption in various parts of the circuit, for example, in buffers 1221 and 1224, as they operate in their linear regions until the resolution of the contention. At the limit, the latch or flip-flop reaches its breakdown point and power consumption within it becomes unpredictable. Note that, although FIGS. 12 and 13 show intrinsic delay and power consumption as a function of setup time, similar results apply to the hold constraint or other constraints generally.

Figure 14:
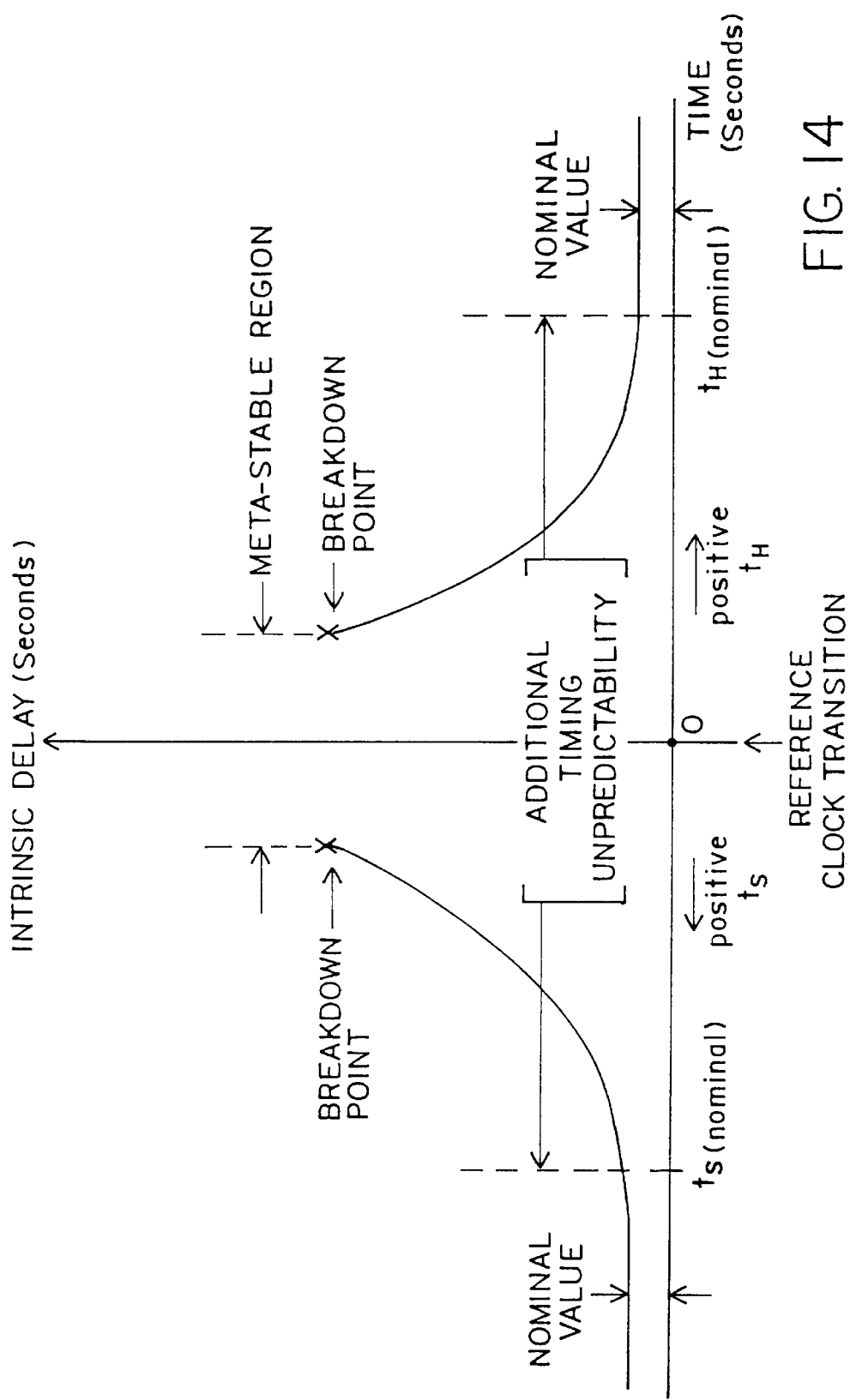
FIG. 14 illustrates a meta-stable region formed between the breakdown points of the plots of intrinsic delay as functions of setup time and hold time.

FIG. 14 shows plots of intrinsic delay as a function of setup time, $t_S$, and hold time, $t_H$. Note that intrinsic delay has a nominal value for setup and hold times larger than certain values (shown as $t_{S(nominal)}$ and $t_{H(nominal)}$, respectively). As setup time and hold time decrease below $t_{S(nominal)}$ and $t_{H(nominal)}$, respectively, intrinsic delay increases, giving rise to additional timing unpredictability within the circuit. At the limit, the circuit reaches its breakdown point, causing the circuit to fail to operate correctly or as desired. The region between the setup time and the hold time at the breakdown point constitutes a meta-stable region (MSR). The MSR typically varies from one cell to the next. No data transition should occur within the MSR of a given cell.

Figure 15A:
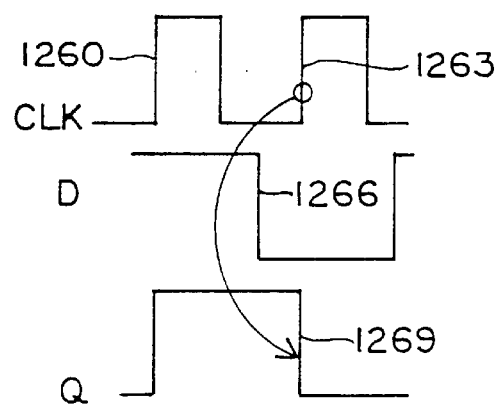
FIG. 15A shows a set of waveforms that correspond to the operation of a D-type flip-flop, indicating that no violation of the setup constraint has occurred.
Figure 15B:
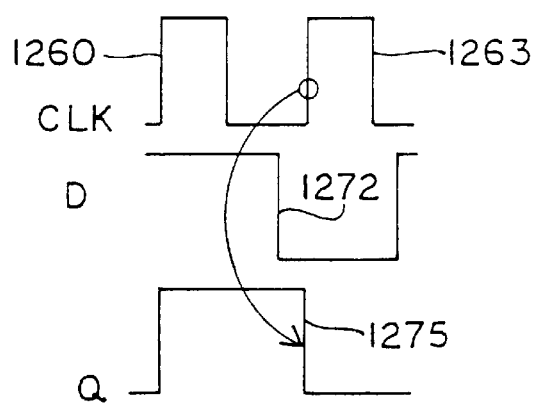
FIG. 15B depicts a second set of waveforms that correspond to the operation of the D-type flip-flop, showing that no violation of the setup constraint has occurred.
Figure 15C:
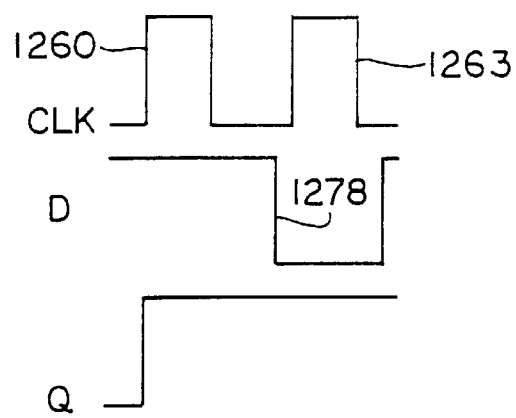
FIG. 15C illustrates a third set of waveforms that correspond to the operation of the D-type flip-flop, indicating that a violation of the setup constraint has occurred.

To illustrate, FIGS. 15A–15C show the exemplary effects of setup time and hold time on the operation of a flip-flop, in particular, a positive-edge-triggered flip-flop. In FIG. 15A, the flip-flop holds a logic high value following clock transition 1260. The D input makes a high-to-low transition 1266 during the period between the two clock transitions 1260 and 1263. The transition 1266 occurs sufficiently long before the clock transition 1263 and the D input stays at a low level for a sufficiently long time after the transition 1263 for the flip-flop to exhibit a nominal intrinsic delay. The flip-flop transmits the transition 1266 to its output, causing a transition 1269 on the Q output.

In FIG. 15B, the same set of events occurs, except that the D input has a transition 1272 closer to the clock transition 1263, but still without a setup constraint failure. Consequently, the flip-flop correctly transmits the value at its D input to its output, Q, although with increased intrinsic delay compared to FIG. 15A. In FIG. 15C, the D input has its transition 1278 sufficiently close to the clock transition 1263 that a violation of the setup constraint occurs. As a result, the flip-flop fails to transmit the transition 1278 on the D-input to its output, Q. Ensuring proper operation of the flip-flop therefore depends, among other things, on proper characterization of the setup and hold constraints.

Characterizing setup and hold constraints for latches and flip-flops often involves a trade-off between performance and predictability of the cell's operation. To operate the cell at higher frequencies, one may use a model that does not accommodate the non-linear behavior of the constraints. Doing so, however, reduces the predictability of the operation of the cell. The traditional approach to constraint characterization, such as setup and hold characterization, uses independent characterization of constraints that often produces overly-optimistic results that do not accommodate the non-linear behavior and the interaction of the constraints.

Figure 16A:
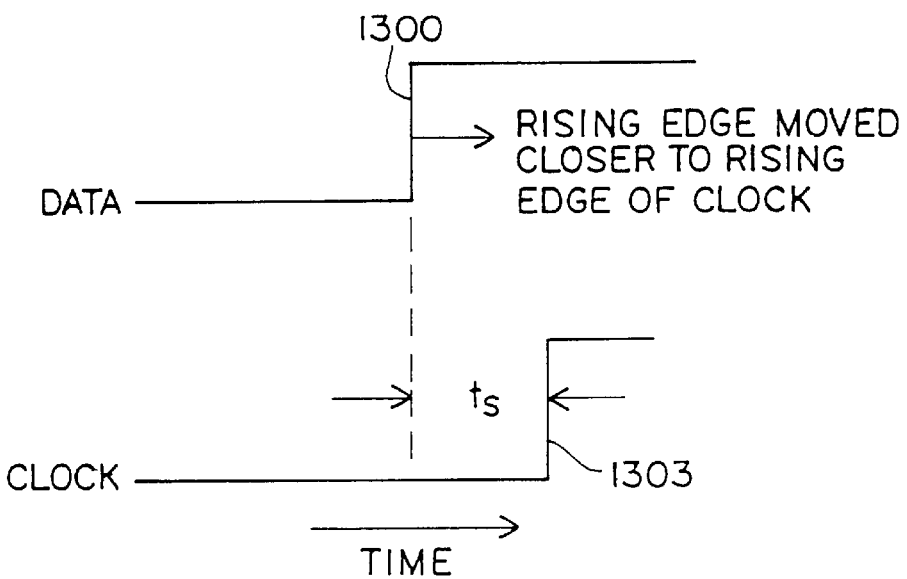
FIGS. 16A and 16B depict a set of waveforms that correspond to independent characterization of a setup constraint.
Figure 16B:
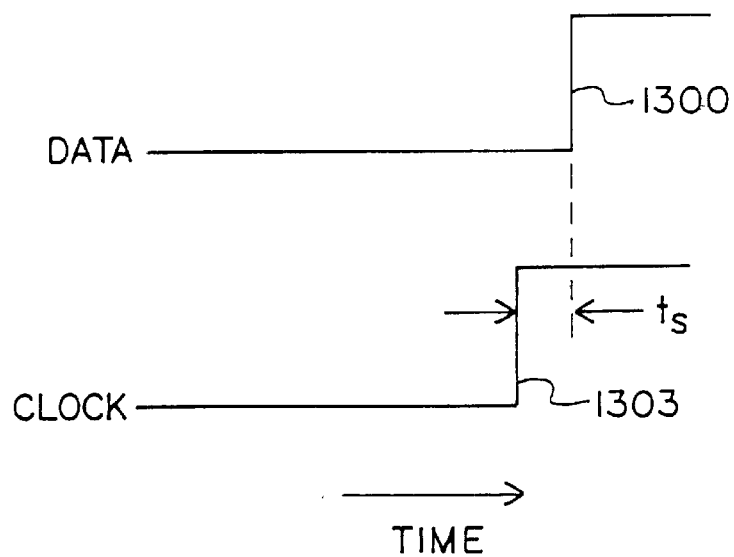

To illustrate, FIGS. 16 and 17 show, respectively, independent characterization of setup and hold for a latch, for example, the latch of FIG. 8A. Referring to FIG. 16A, to characterize the setup time, one sweeps a rising edge 1300 of the latch's data signal toward a rising edge 1303 of the latch's clock signal to search for a violation of the setup constraint. At each position of the rising edge 1300, one performs a simulation of the latch to determine whether violation of the setup constraint has occurred. FIG. 16B shows the situation when the data rising edge 1300 has moved close enough in time to the clock rising edge 1303 so as to cause the latch to reach its breakdown point. The time interval between the data rising edge 1300 and the clock rising edge 1303 constitutes an independently characterized setup time for the latch.

Note that in FIG. 16B, the data rising edge 1300 resides to the right of the clock rising edge 1303. In other words, the latch exhibits a negative setup time. This situation illustrates an example of how different buffering and circuit delays within the latch may give rise to a negative setup time. Referring to FIG. 8B, if buffering causes the clock signal to take longer for the clock signal to travel to pass gate 1218 than it takes the data signal to arrive at the input of buffer 1221, the latch may exhibit a negative setup time.

Figure 17A:
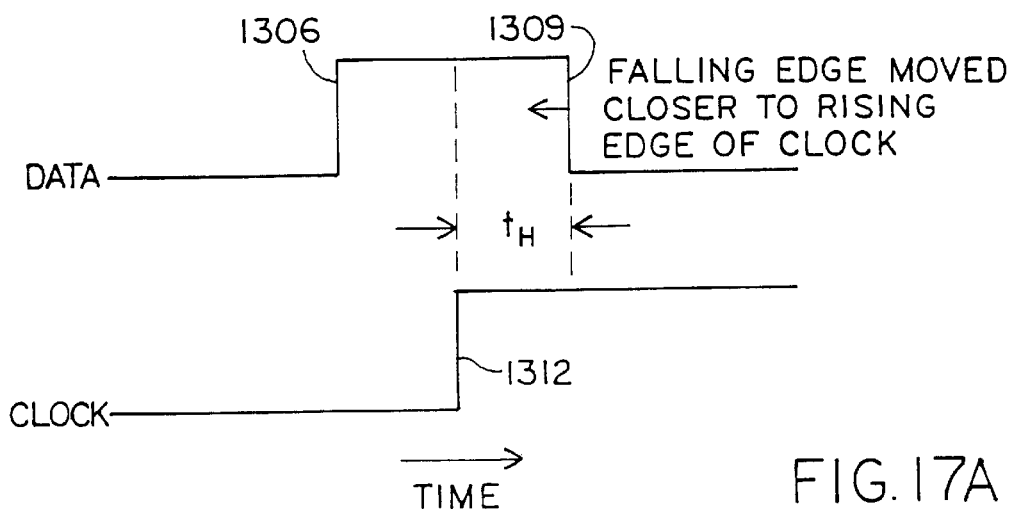
FIGS. 17A and 17B illustrate a set of waveforms that correspond to independent characterization of a hold constraint.
Figure 17B:
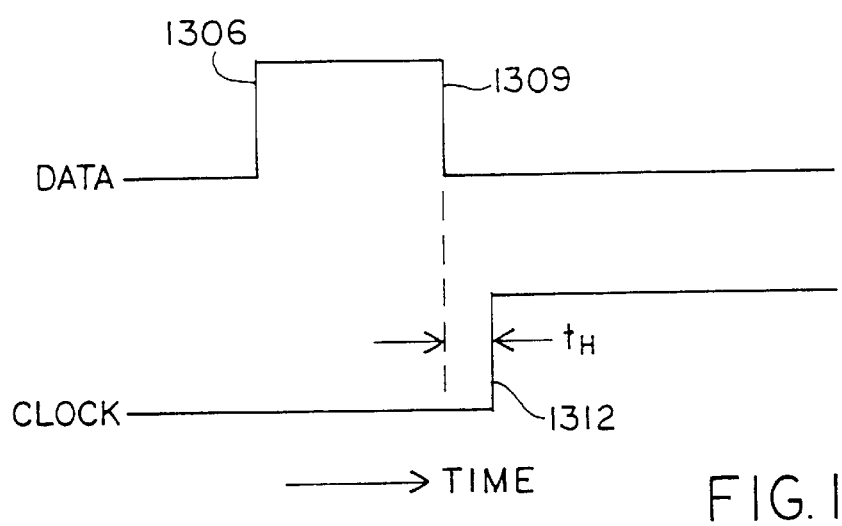

FIGS. 17A and 17B show independent characterization of the hold constraint for the latch. Referring to FIG. 17A, to characterize the hold time, one arranges a rising edge of the data signal at a sufficiently long time (effectively at infinity) before a rising edge 1312 of the clock signal so as not to affect the hold characterization. For example, one may hold the data rising edge 1306 at a point in time that corresponds to a setup time longer than the nominal setup time shown in FIG. 14 (effectively the rising edge of the data signal takes place at infinity relative to the clock rising edge 1312). For sufficiently large values of the hold time, the output of the latch properly reflects the change in the D-input. Next, one sweeps a falling edge 1309 of the latch's data signal toward the clock rising edge 1312. At each position of the falling edge 1309, one performs a simulation of the latch to determine whether violation of the hold constraint has occurred.

FIG. 17B shows the situation when the data falling edge 1309 has moved close enough in time to the clock rising edge 1312 so as to cause the latch to fail to preserve the new data state at its output (i.e., a hold violation occurs). In other words, as a result of the hold constraint violation, the output of the latch fails to properly reflect the change in the D-input. The time interval between the previous successful data falling edge 1309 and the clock rising edge 1312 constitutes an independently characterized hold time for the latch. Note that in FIG. 17B, the data falling edge 1309 resides to the left of the clock rising edge 1312, i.e., the latch exhibits a negative hold time. This situation may occur for reasons similar to those described above with respect to the negative setup time shown in FIG. 16B.

Figure 17C:
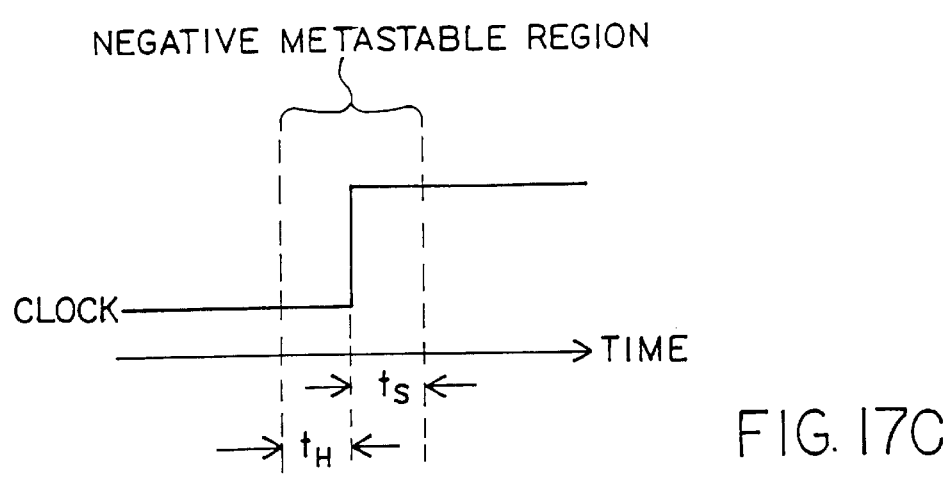
FIG. 17C depicts a negative meta-stable region as a result of independent characterizations of the setup and hold constraints.

Because of the mutually exclusive characterizations of the setup and hold time in FIGS. 16 and 17, respectively, setup and hold characterizations using the traditional technique are independent of each other. In other words, this technique produces results that tend to be overly optimistic because they correspond to the best-case setup and hold times. The results produce an anomaly known as the negative meta-stable region (NMSR). FIG. 17C shows a plot of setup and hold times acquired using this technique as in FIGS. 16 and 17, respectively, referenced to the clock's rising edge.

The interval between the setup and hold times in FIG. 17C constitutes a negative number, the NMSR, which does not correspond to the actual operation of a latch circuitry fabricated and tested in a laboratory. Note that the interval constitutes a negative number because, as FIG. 17C shows, the hold time occurs before the setup time. Note also that FIG. 17C shows one situation where an NMSR exists. As persons of ordinary skill in the art would understand, other situations may also exist that give rise to an NMSR.

Constraint acquisition techniques according to the invention overcome the problems associated with the independent acquisition of constraints. The invention contemplates dependent constraint acquisition, optimized constraint acquisition, and inter-dependent constraint acquisition. One aspect of the invention concerns dependent acquisition of constraints, such as setup and hold constraints for latches and flip-flops. FIGS. 18 and 19 illustrate dependent acquisition of setup and hold, respectively. Note that FIGS. 18 and 19 merely illustrate the principle of dependent constraint acquisition according to the invention. One may apply dependent constraint acquisition to related constraints other than setup and hold, as desired.

Figure 18A:
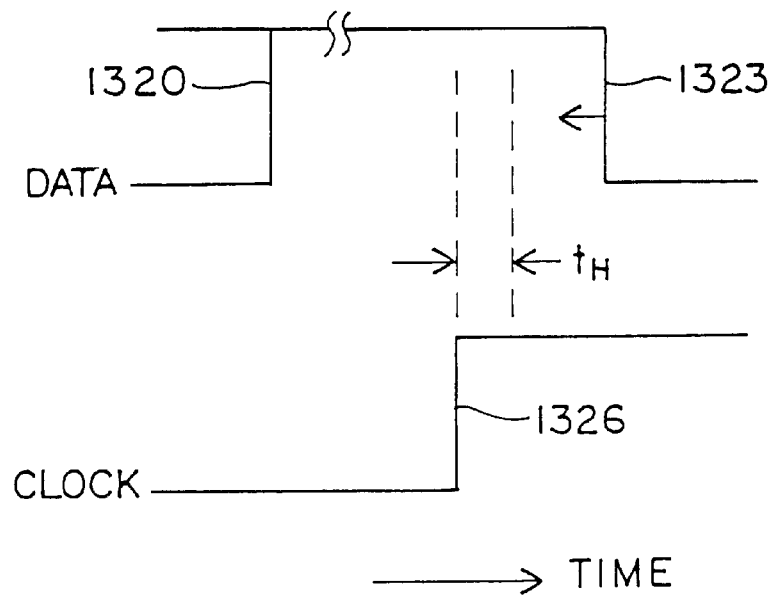
FIGS. 18A and 18B show a set of waveforms that correspond to dependent characterization of a setup constraint according to the invention.

FIG. 18 shows acquisition of dependent setup, which involves two steps. The first step characterizes the hold constraint in an independent manner. The second step uses the acquired value of the hold constraint from the first step to characterize the setup constraint. Referring to FIG. 18A, to characterize dependent setup, one arranges the rising edge 1320 of the data signal a sufficiently long time (effectively infinity) before the rising edge 1326 of the clock signal that the rising edge 1320 of the data signal does not affect the acquisition of the hold time. Next, one sweeps (for example, by using a search mechanism) a falling edge 1323 of the latch's data signal toward the clock rising edge 1326. At each position of the falling edge 1323, one performs a simulation of the latch to determine whether violation of the hold constraint has occurred. Through repetitive simulations, one obtains the hold constraint of the latch in an independent manner.

Figure 18B:
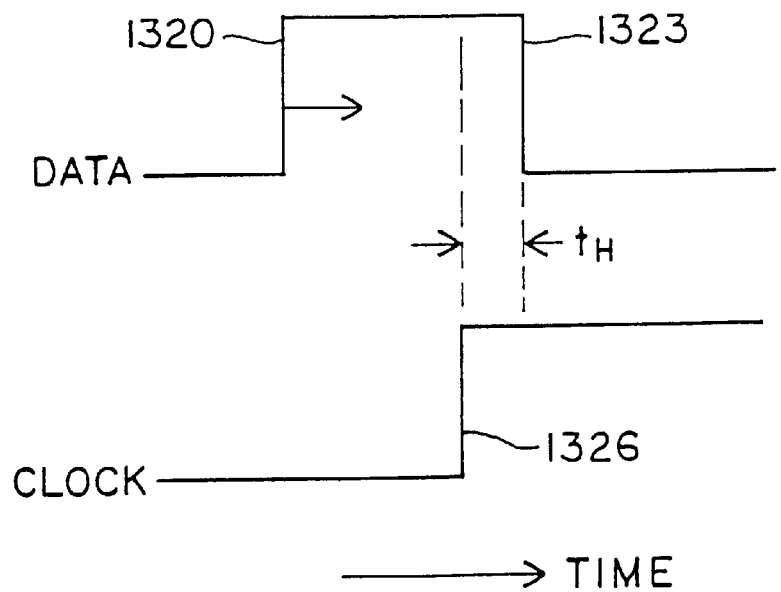

FIG. 18B shows the second step of dependent setup characterization according to the invention. Here, one holds the falling edge 1323 of the data signal at a point in time that corresponds to the independently characterized value of the hold constraint in step one. Then, one sweeps (for example, by using a search mechanism) rising edge 1320 of the latch's data signal toward the clock rising edge 1326. At each position of the rising edge 1320, one performs a simulation of the latch to determine whether violation of the setup constraint has occurred, until one acquires the setup constraint. Note that the characterization of the setup constraint in step two depends on the independently characterized hold constraint in step one. That dependency results in a positive meta-stable region and, hence, overcomes the negative meta-stable region problem associated with independent characterization of setup and hold, discussed above.

Figure 19A:
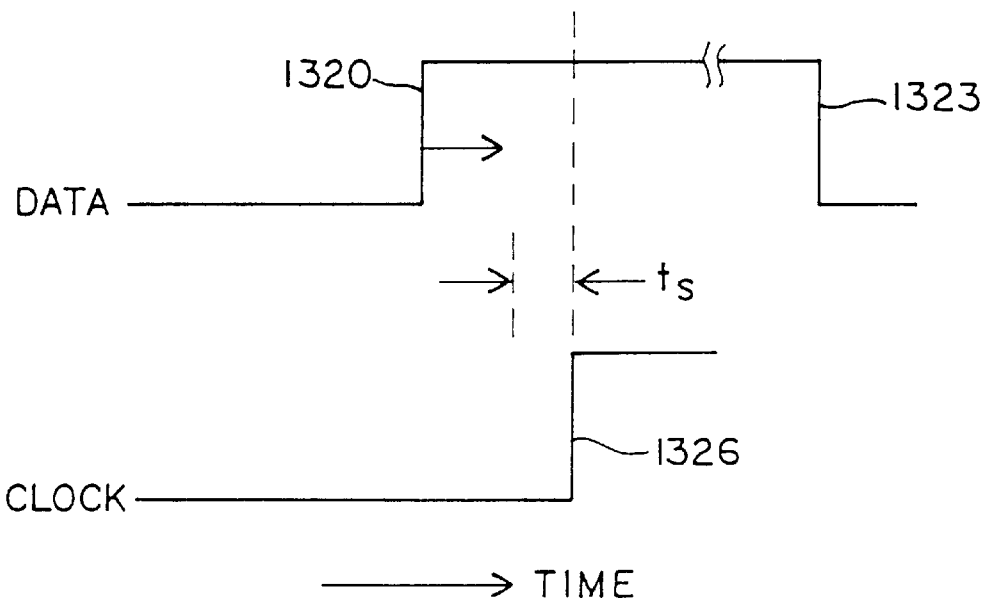
FIGS. 19A and 19B depict a set of waveforms that correspond to dependent characterization of a hold constraint according to the invention.

FIG. 19 shows acquisition of dependent hold, which also involves two steps. The first step characterizes the setup constraint in an independent manner. The second step uses the characterization of the setup constraint from the first step to characterize the hold constraint. Referring to FIG. 19A, to characterize dependent hold, one arranges the falling edge 1323 of the data signal a sufficiently long time (effectively infinity) before the rising edge 1326 of the clock signal that the falling edge 1323 of the data signal does not affect the acquisition of the setup time. Next, one sweeps (for example, by using a search mechanism) a rising edge 1320 of the latch's data signal toward the clock rising edge 1326. At each position of the rising edge 1320, one performs a simulation of the latch's behavior to determine whether violation of the setup constraint has occurred. By using repetitive simulations, one obtains the setup constraint of the latch in an independent manner.

Figure 19B:
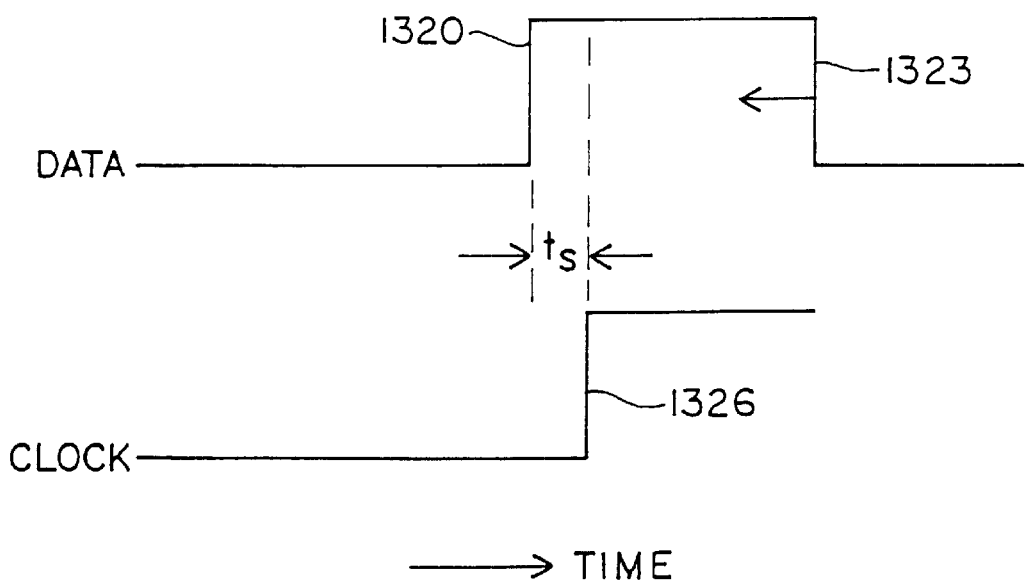

FIG. 19B shows the second step of dependent hold characterization according to the invention. Here, one holds the rising edge 1320 of the data signal at a point in time that corresponds to the independently characterized value of the setup constraint in step one. Then, one sweeps (for example, by using a search mechanism) falling edge 1323 of the latch's data signal toward the clock rising edge 1326. At each position of the falling edge 1323, one performs a simulation of the latch to determine whether violation of the hold constraint has occurred, until one acquires the hold constraint. Thus, the characterization of the hold constraint in step two depends on the independently characterized setup constraint in step one. As with dependent setup characterization described above, the dependent hold characterization results in a positive meta-stable region. The positive meta-stable region overcomes the negative meta-stable region problem associated with independent constraint characterization, as discussed above.

Another aspect of the invention concerns optimized constraint characterization. Under some circumstances, dependent constraint characterization, for example, the dependent setup characterization or the dependent hold characterization described above, may produce somewhat pessimistic results. In other words, it may produce a meta-stable region that is wider than desired or necessary. Circuit designers may seek to have a more aggressive meta-stable region that corresponds to an increased operating frequency of the latch. Optimized characterization seeks to provide a more aggressive meta-stable region than does the dependent constraint characterization techniques discussed above. Optimized characterization locates the final values of the constraints, such as the setup and hold constraints, by simultaneously adjusting the values of the constraints within two respective ranges, as described below in detail.

Optimized constraint characterization includes three steps. In the first step, one characterizes the setup constraint independently. In the second step, one characterizes the hold constraints independently. The third step modifies or adjusts the independently acquired values of the setup and hold constraints so as to avoid an invalid region of circuit operation, for example, a negative meta-stable region or an overly optimistic meta-stable region. Optimized constraint characterization provides more aggressive, yet realistic, values for the constraints, such as the setup and hold constraints. FIGS. 20 and 21 correspond to the three steps of optimized constraint characterization.

Figure 20A:
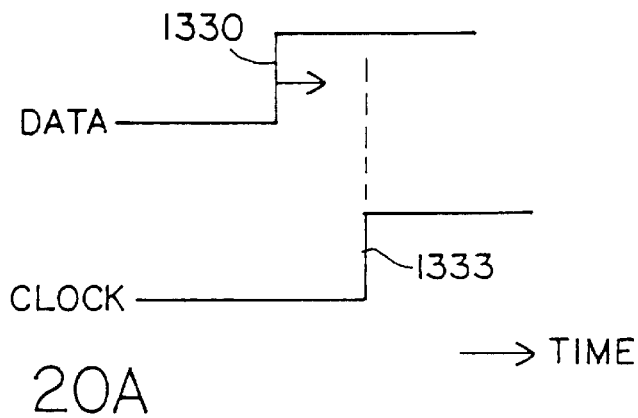
FIGS. 20A–20D illustrate optimized characterization of setup and hold constraints according to the invention.
Figure 21:
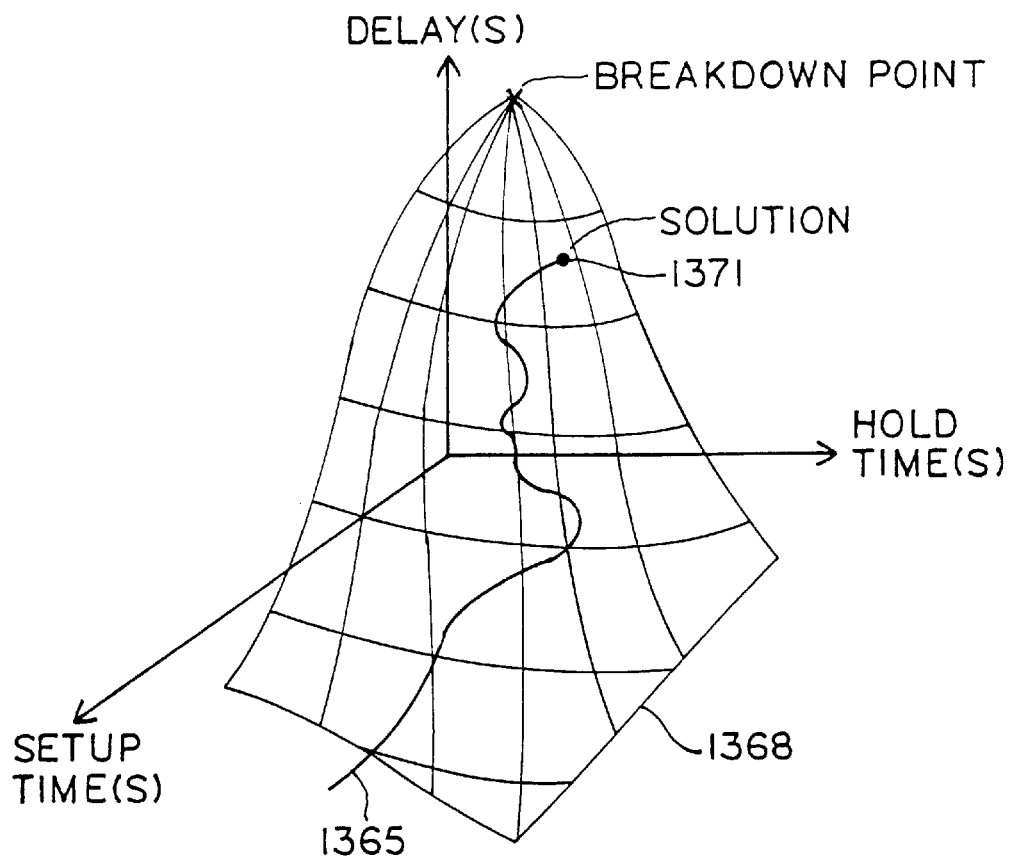
FIG. 21 shows a plot of an exemplary solution path for inter-dependent characterization of setup and hold constraints according to the invention.

Referring to FIG. 20A, to characterize the setup time in the first step, one sweeps (for example, by using a search mechanism) a rising edge 1330 of the latch's data signal toward a rising edge 1333 of the latch's clock signal. At each position of the rising edge 1330, one performs a simulation of the latch to determine whether violation of the setup constraint has occurred. At some point, the data rising edge 1330 moves close enough in time to the clock rising edge 1333 so as to cause the latch to reach its breakdown point. The time interval between the data rising edge 1330 and the clock rising edge 1333 constitutes an independently characterized setup time for the latch.

Figure 20B:
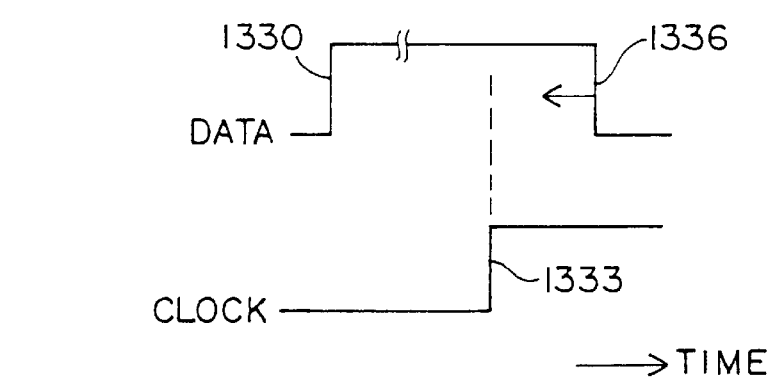

FIG. 20B shows independent characterization of the hold constraint in the second step of optimized constraint characterization. Here, one arranges rising edge 1330 of the data signal at a sufficiently long time (effectively infinity) before a rising edge 1333 of the clock signal so as not to affect the hold characterization. Next, one sweeps (for example, by using a search mechanism) falling edge 1336 of the latch's data signal toward the clock rising edge 1333. At each position of the falling edge 1336, one performs a simulation of the latch to determine whether violation of the hold constraint has occurred. At some point, the falling edge 1336 moves sufficiently close in time to clock rising edge 1333 that the latch reaches its breakdown point. The time interval between the data falling edge 1336 and the clock rising edge 1333 constitutes an independently characterized hold time for the latch.

Figure 20C:
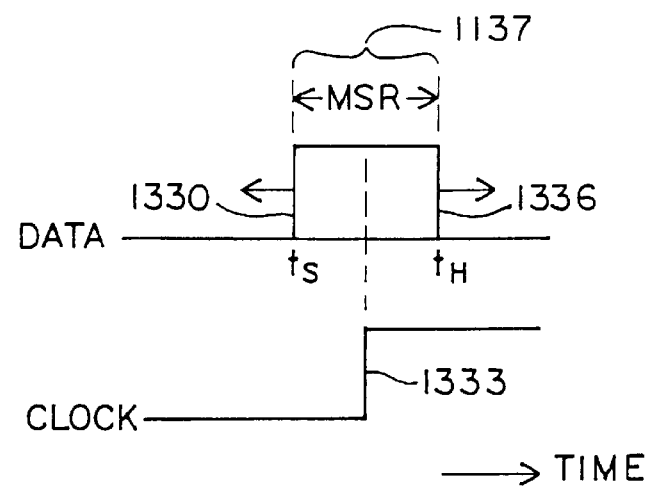

As noted above, independent characterization of setup and hold constraints may lead to an overly optimistic meta-stable region or a negative meta-stable region. Referring to FIG. 20C, in step three, optimized constraint characterization according to the invention moves data rising edge 1330 and data falling edge 1336 away from the reference clock edge 1333 so as to widen the meta-stable region. As the edges 1330 and 1336 move away from clock edge 1333, at some point one observes a transition in the output of the latch when one simulates the behavior of the latch, i.e., one obtains a valid meta-stable region. In other words, step three of the optimized constraint characterization starts with the constraint characterizations of steps one and two and moves out edges 1330 and 1336 to provide a valid meta-stable region. In exemplary embodiments of the invention, if the values of the setup and hold times acquired in steps one and two correspond to a valid meta-stable region, step three makes no adjustment to those values.

Characterizations of the setup and hold constraints use the clock edge 1333 in FIG. 20C as a reference point. Thus, FIG. 20C illustrates positive values for both the setup and hold constraints, which correspond to a positive meta-stable region. Although region 1137 in FIG. 20C corresponds to a positive meta-stable region, under some circumstances the region 1137 may correspond to a negative meta-stable region (i.e., $t_H$ occurs before $t_S$). If $t_H$ occurs before $t_S$ (corresponding to an NMSR), step three of optimized characterization according to the invention reverses or switches the positions of $t_H$ and $t_S$. Reversing or switching the positions of $t_H$ and $t_S$ under those circumstances enforces a positive meta-stable region.

Figure 20D:
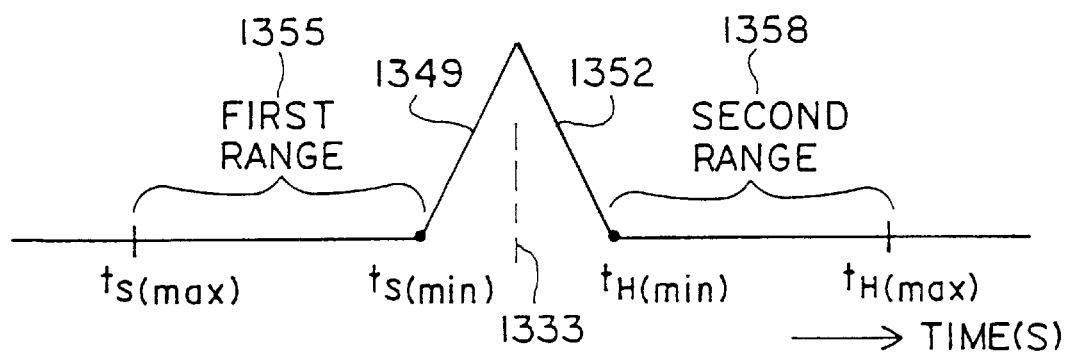

FIG. 20D illustrates more details of how step three of the optimized constraint characterization operates. Here, one starts with setup and hold values of $t_S(min)$ and $t_H(min)$, which correspond to values of the independently characterized setup and hold constraints from steps one and two, respectively. Next, one establishes a first range 1355 and a second range 1358. Optimized characterization according to the invention searches for the final values of the setup and hold constraints within the first and second ranges 1355 and 1358, respectively.

As FIG. 20D shows, to establish the first and second ranges 1355 and 1358, one uses the values $t_{S(min)}$ and $t_{H(min)}$ together with values $t_{S(max)}$ and $t_{H(max)}$. One may obtain values for, or assign values to, $t_{S(max)}$ and $t_{H(max)}$ in a variety of ways. For example, the user may provide the values of $t_{S(max)}$ and $t_{H(max)}$. As another example, one may use the rise and fall times of the rising transition 1349 and falling transition 1352, which correspond, respectively, to the rising and falling transitions used in steps one and two of optimized characterization. One may then use $t_{S(max)}=t_{S(min)}+k_1 \cdot t_{rise}$ and $t_{H(max)}=t_{H(min)}+k_2 \cdot t_{fall}$, where $t_{rise}$ and $t_{fall}$ denote the rise time and the fall time, respectively. Note that $k_1$ and $k_2$ represent scaling factors that may have values less than, equal to, or greater than unity, as desired.

As an alternative, one may assign values to the widths of the first and second ranges 1355 and 1358 and calculate the values of $t_{S(max)}$ and $t_{H(max)}$ accordingly. One may assign the widths of the first and second ranges 1355 and 1358 in a variety of ways. For example, one may obtain values from the user that correspond to the widths of the first and second ranges 1355 and 1358. As another example, one may use a scaled value of the intrinsic delay of the cell or circuit under test. As yet another example, one may use a scaled value of the clock period that clocks the cell or circuit under test.

After establishing first and second ranges, one starts with the values of the setup and hold constraints obtained in steps one and two and re-positions the setup and hold constraints within the first and second ranges 1355 and 1358, respectively. In other words, one moves the values of the setup and hold constraints away from clock edge 1333 in FIG. 20D. To re-position the setup and hold constraints within the first and second ranges 1355 and 1358, respectively, one may use any suitable search technique. The well-known binary search constitutes one such technique, although one may use other techniques, as desired. Note that the search proceeds in a dependent fashion, i.e., the estimated values of the setup and hold constraints move simultaneously as the search progresses.

The search typically proceeds in several steps. At each step of the search within the first and second ranges 1355 and 1358, one performs a simulation of the circuit to determine whether it satisfies objective criterion or criteria and/or auxiliary measurements prescribed by the user. The objective criteria may include, among others, whether the signal transition at the data input of the latch causes a corresponding signal transition at the output of the latch. The auxiliary measurements, may include, for example, output transition time, slew rate, and switching power of the latch, and the like, as desired.

If the output of the latch satisfies the objective criteria (e.g., if it has a valid transition) and/or the auxiliary measurements, then the optimized characterization technique has acquired final values for the setup and hold constraints. On the other hand, if the output of the latch fails to have a valid transition, one continues to search and simulate until one reaches the termination condition, i.e., the output has a valid transition or the range sizes become smaller than the resolution of the simulation. At that point, the values of setup and hold constitute the final values of the setup and hold constraints acquired according to optimized characterization. In summary, by adjusting the values of the setup and hold within their respective ranges, optimized constraint characterization avoids an invalid region of operation of the circuit.

Another aspect of the invention concerns inter-dependent constraint characterization. In inter-dependent constraint characterization the edges of the meta-stable region move simultaneously and independently relative to the reference clock edge. In other words, inter-dependent characterization according to the invention locates the final values of the constraints, such as setup and hold, by simultaneously and independently adjusting the values of the constraints. The name "inter-dependent" denotes the fact that the technique accounts for both constraints simultaneously, which permits the two constraints to interact with each other (i.e., react to each other in a mutually dependent manner).

FIG. 21 helps to illustrate inter-dependent constraint characterization according to the invention. FIG. 21 shows a plot of an exemplary response-surface 1368 of intrinsic delay as a function of two constraints, here setup and hold times. The plot shows that, when considered simultaneously, more than one combination of the setup and hold times can lead to the same value for the intrinsic delay for the cell or circuit. The inter-dependent constraint characterization technique seeks to locate the smallest possible meta-stable region, given search conditions set by the user (e.g., delay degradation, described below in detail).

The inter-dependent technique uses a search mechanism to obtain successive values of the setup and hold constraints. The inter-dependent technique characterizes or seeks to predict the shape of the intrinsic-delay response plot 1368 as it evaluates each combination of values for the setup and hold constraints. By doing so, the inter-dependent characterization technique allows the search mechanism to traverse the response surface 1368 of the intrinsic delay, without prior knowledge of the response surface, to locate an optimal combination of the setup and hold times.

To begin searching, inter-dependent characterization according to the invention selects values for the setup and hold constraints that correspond to the nominal delay of the cell or circuit (a point at or near the beginning of path 1365 in FIG. 21). To select those values, one may employ any of a variety of techniques. For example, one may use a scaled value of the slowest input slew-rate applied (or expected to be applied) to the cell or circuit and use a search mechanism to find where the linear nominal delay region ends. In other words, one locates a point on the response surface 1368 where a line tangent to the surface 1368 has a slope of unity or about unity.

One may then use a suitable search mechanism to adjust the values of setup and hold in a manner that generally tends toward smaller values for setup and hold constraints. Note that generally one may use any of a variety of suitable search techniques, as desired. The search mechanism estimates through mathematical analysis, for example, by using mathematical formulae, the shape of the response surface 1368. The choice of the mathematical analysis or formulae used depends on the technology and/or design methodology used in the cell or circuit under test. The search mechanism gathers and analyzes trend data to estimate the shape (e.g., the direction of change and inflection points) of the response surface 1368. In exemplary embodiments of the invention, the search mechanism uses a suitable error-estimating techniques to avoid local minima that may lead to false results.

The search mechanism in the inter-dependent characterization technique recognizes the breakdown region of the response surface 1368 (i.e., where the measurement of intrinsic delay fails) and takes measures to return the search to other parts of the response surface 1368 if it encounters the breakdown point or region. The search terminates when the search mechanism locates a valid solution point, such as point 1371 in FIG. 21. The valid solution point 1371 provides valid values for the setup and hold constraints that represent the smallest meta-stable region found from the response surface 1368, given the search conditions that the user has established (e.g., delay degradation, as described below in detail).

Note that, generally, either the setup time or the hold time may have a negative value. Both setup and hold times, however, should not have negative values, as a negative setup time together with a negative hold time results in a negative meta-stable region. To avoid the negative meta-stable region, either the setup time or the hold time (or both) should have a positive value. In other words, a positive setup time or a positive hold time (or both) result in a positive meta-stable region. Note that both the setup and hold times need not have positive values to avoid the negative meta-stable region. As long as the setup time is positive, the hold time may be negative, and vice-versa.

Constraint characterization according to the invention produces a positive meta-stable region. In the case of characterizing dependent constraints, the independently characterized constraint may have a negative value. The dependent constraint, however, has a positive value. In the case of optimized constraint characterization, the independently acquired initial values of the constraints may have negative values. The third step of the optimized constraint characterization, however, results in positive values for one or both of the constraints.

Note that, generally, two ways exist for determining when one should cease searching for a constraint (such as setup and hold), i.e., the termination condition of the constraint characterization. In other words, two techniques exist for deciding when one has acquired the desired constraint. The first technique uses the breakdown in the circuit's or cell's operation. The above discussion of constraint characterization assumes use of the breakdown point (e.g., one looks for violation of a constraint in the form of breakdown in the circuit's response). Rather than using breakdown, however, one may alternatively use degradation to determine when to stop searching for a constraint.

Degradation generally refers to the change in the behavior of a cell or circuit when an environmental condition or stimulus approaches the cell's or the circuit's breakdown point. Even when a circuit or cell operates within its tolerances (i.e., it has not reached its breakdown point), it may still fail to operate predictably because of its degraded behavior. For example, as a cell reaches its breakdown point, it may experience degraded intrinsic delay. Referring to FIG.

4 or FIG. 14, the cell may take a longer period of time to produce its output in response to a change in its inputs as a constraint time exceeds a nominal value. As another example, the cell may experience degraded (i.e., increased) power consumption as it nears its breakdown point. FIG. 5, for example, shows an example of a cell that consumes more power as the constraint time exceeds a nominal value.

The choice of using breakdown or degradation as the termination condition depends on the type of cell or circuit that one wishes to characterize. Under some circumstances, using breakdown may be more appropriate, and vice-versa. As an example, consider the situation where one wishes to characterize the hold constraint for a latch. In that case, one sets the rising edge of the data signal sufficiently away in time from the reference clock edge and then sweeps (for example, by using a search mechanism) the falling edge of the data signal toward the reference clock edge. At some point, a violation of the hold constraint occurs. In other words, the output of the latch shows a first transition that corresponds to the rising edge of the data signal, but also includes a second transition that corresponds to the violation of the hold constraint (i.e., the latch fails to retain its intended output signal). The second transition therefore denotes an invalid output value, and one should not apply degradation to it because the use of degradation implies the existence of a measurable transition. Thus, in this example, i.e., characterizing the hold constraint for a latch, one should use breakdown, rather than degradation, as the termination condition.

In illustrative embodiments of the invention, the programming of the characterization tool includes identification and proper treatment of situations in which use of one or the other termination condition is more appropriate than using the other condition. Depending on the type of circuit or cell that it characterizes, the characterization tool may therefore suggest use of a particular termination condition to the user or automatically use a particular termination condition according to its programming, as desired.

One may degrade a variety of a cell's or circuit's attributes. For example, one may degrade intrinsic delay, output slew-rate, or power consumption. Degrading the intrinsic delay typically produces more variation than other attributes, such as power consumption, output slew-rate, etc. Moreover, delay is typically the attribute of the cell or circuit that designers seek to characterize. Output slew rate is a more sensitive attribute than intrinsic delay, and has a relatively narrow band of variation. The relatively narrow band of variation also typically leads to longer simulation times because of the increased precision and less tolerance used during simulation. Degrading the consumed power allows designers of mobile and battery-powered equipment to improve their characterizations of the power-consumption of the circuits they design.

The user of the characterization tool can use degradation to trade the predictability of the model used in characterization for the performance of the cell or circuit characterized. In characterizing constraints according to the invention, one may use four degradation options: (1) absolute-from-nominal degradation, (2) unity-slope degradation, (3) absolute-from-breakdown degradation, and (4) normalized intersection degradation. The user may choose any of those degradation options, as desired. In illustrative embodiments of the invention, once the user has selected a degradation option, the characterization tool applies that degradation option to acquisitions of all constraints of a given cell or circuit.

Figure 22:
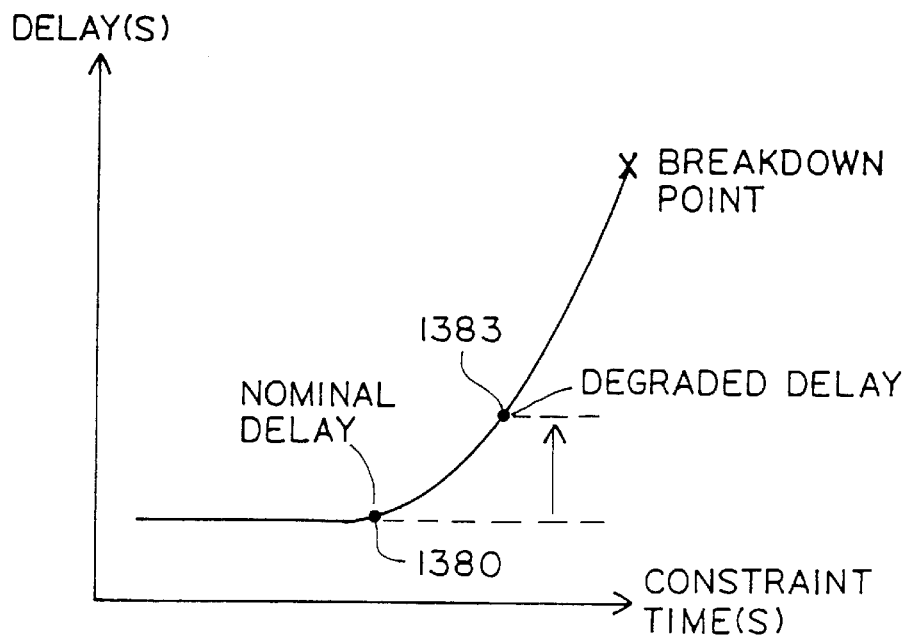
FIG. 22 depicts plots that correspond to the absolute-from-nominal delay degradation option according to the invention.

FIG. 22 shows an example of how one may use the absolute-from-nominal degradation option. The plot in FIG. 22 represents the intrinsic delay of the cell or circuit as a function of constraint time. The cell has a nominal delay denoted at, for instance, point 1380 on the plot. To use absolute-from-nominal degradation, the user specifies a scalar, which may represent a percentage. The characterization tool calculates a degraded delay (corresponding to point 1383 in FIG. 22) that exceeds the nominal delay by the user-specified factor. For example, suppose the cell has a nominal delay of 10 ns, and the user specifies a scalar of 0.1, or 10%. The tool would calculate the degraded delay as (1.1×10 ns), or 11 ns. The tool uses as a target the degraded delay rather than the nominal delay in simulations used to characterize the cell. Put another way, the degraded delay becomes the delay target during simulations of the cell. The absolute-from-nominal option represents the simplest and fastest of the degradation options. It has a drawback in that the target cell or circuit may fail to produce an intrinsic delay equal to the target delay before it reaches the breakdown point.

Figure 23:
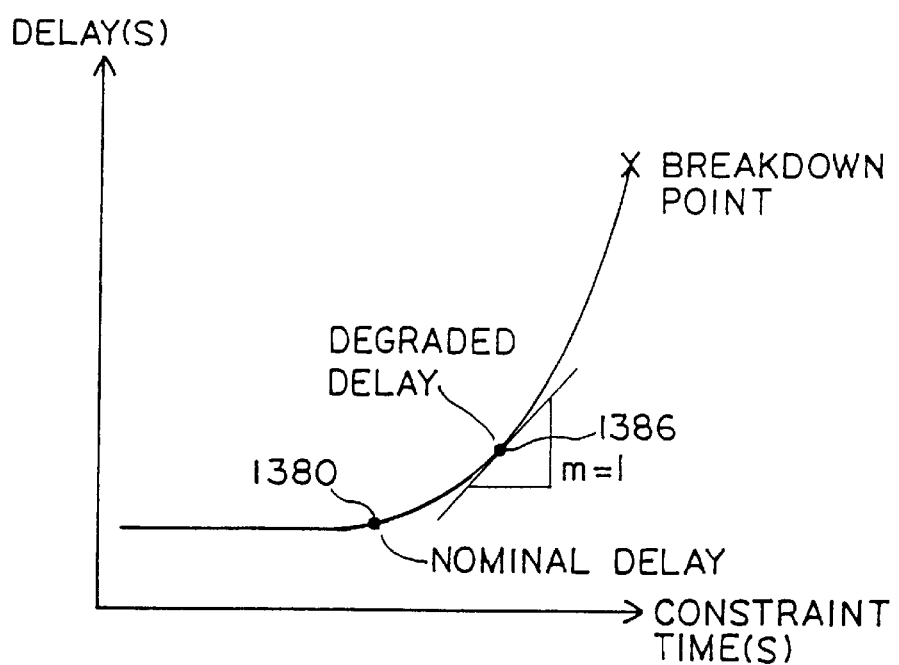
FIG. 23 illustrates plots that correspond to the unity-slope delay degradation option according to the invention.

FIG. 23 illustrates an illustrative embodiment of the unity-slope degradation option according to the invention. The plot in FIG. 23 represents the intrinsic delay of a cell or circuit as a function of constraint time. The cell has a nominal delay at, for example, point 1380 on the plot. The characterization tool locates a point 1386 where the plot of intrinsic delay has a slope of unity or substantially close to unity. The point 1386 typically occurs at the sharp knee in the plot of intrinsic delay. The characterization tool uses the intrinsic delay at point 1386 as the degraded delay, or the delay target, during its simulations of the cell or circuit. This option provides an inherent balance between model predictability and cell performance because it provides a degraded delay, yet not too excessive, delay. Note that the user need not provide a degradation target as is the case with the absolute-from-nominal option described above; the characterization tool performs the calculations without user input.

Figure 24:
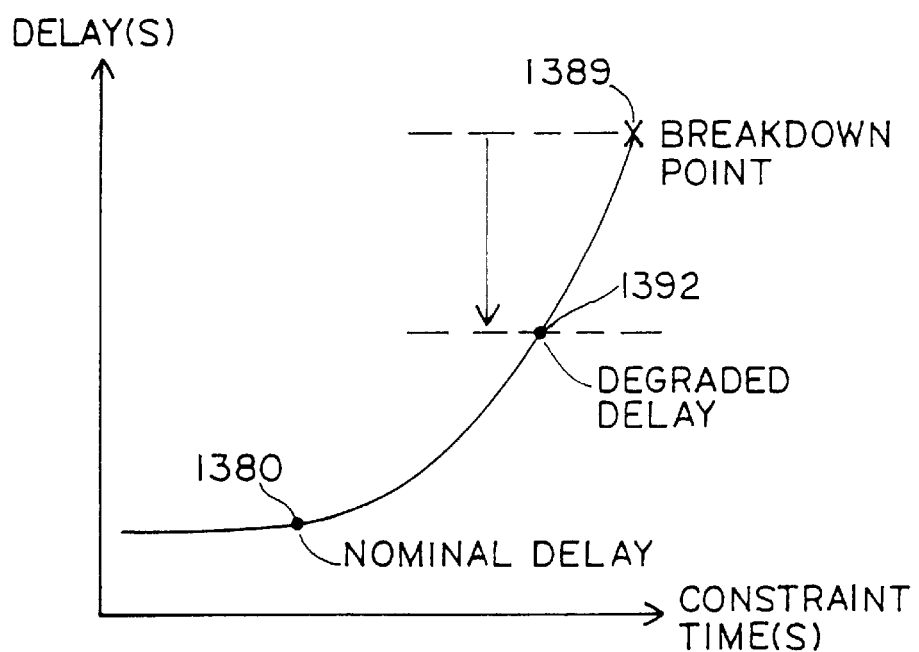
FIG. 24 shows plots that correspond to the absolute-from-breakdown delay degradation option according to the invention.

FIG. 24 provides an illustrative embodiment of the absolute-from-breakdown option according to the invention. The plot in FIG. 24 represents the intrinsic delay of the cell or circuit as a function of constraint time. The cell has a nominal delay at, for example, point 1380 on the plot. The cell also has a breakdown point shown as point 1389. To use absolute-from-breakdown degradation, the user specifies a scalar, which may represent a percentage. In exemplary embodiments of the invention, the user-specified scalar or percentage has a value in the range between the nominal delay of the cell and its delay near the breakdown point. In alternative embodiments, the user may select a scalar or percentage that corresponds to a delay below the nominal delay of the cell. In this scenario, the characterization tool according to the invention includes programming code to prevent an infinite loop (i.e., to prevent the absolute-from-breakdown degradation option within the tool from selecting increasingly large constraint values in an attempt to find decreasing delays).

The characterization tool calculates a degraded delay (corresponding to point 1392 on the plot) that is lower than breakdown point 1389 by an amount equal to the user-specified percentage. In other words, the absolute-from-breakdown option is similar to the absolute-from-nominal option, except that it calculates a degraded delay relative to, and below, the breakdown point. The characterization tool uses the degraded delay rather than either the nominal delay or the breakdown point in simulations used to characterize the cell (the degraded delay becomes the delay target during simulations of the cell). The absolute-from-breakdown option trades model predictability with some cell performance.

Figure 25A:
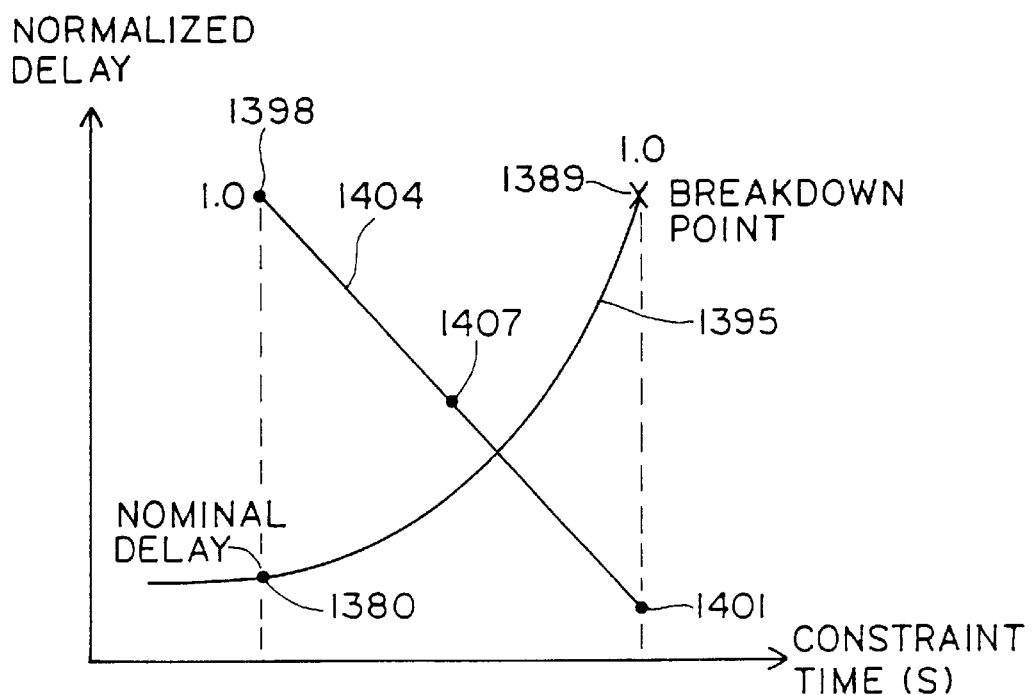
FIGS. 25A and 25B depict plots that correspond to the normalized-intersection delay degradation option according to the invention.
Figure 25B:
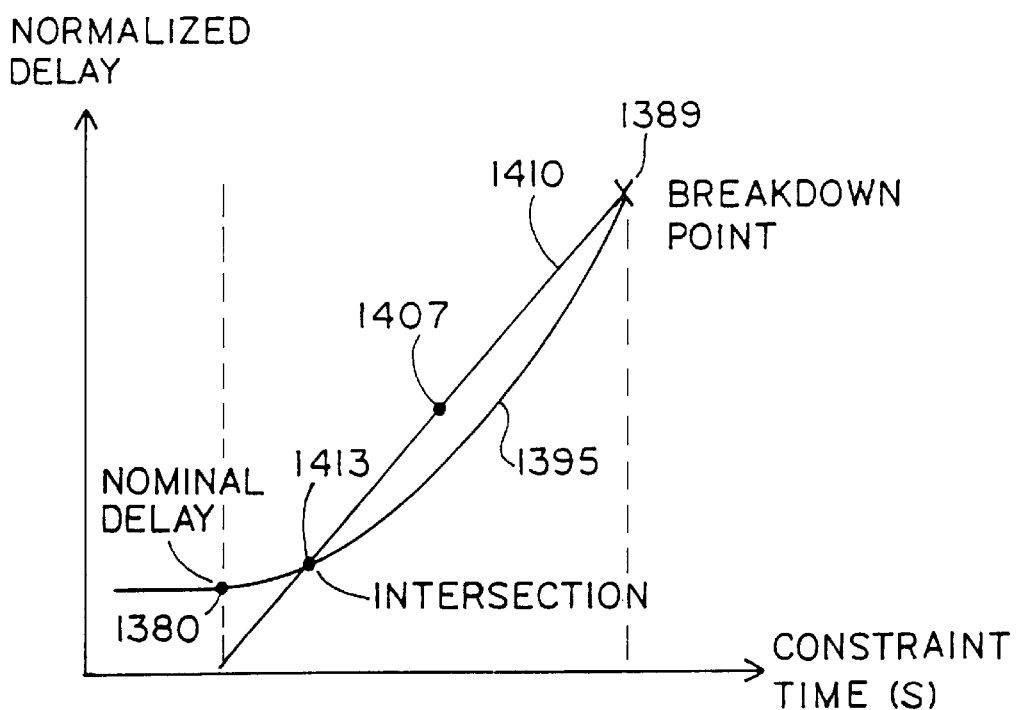

FIGS. 25A and 25B shows illustrative embodiments according to the invention of the normalized intersection option. Conceptually, to use this option one uses values that correspond to two plots superimposed on each other: the plot of normalized delay and a plot of normalized constraint time plotted in reverse (i.e., a mirror-image plot). To generate the first plot, one normalizes the plot of intrinsic delay with respect to the breakdown point. In other words, one divides the values corresponding to the points along the intrinsic delay plot by the highest delay value, i.e., the delay at the breakdown point. FIG. 25A shows a plot 1395 of normalized intrinsic delay.

To generate a plot of normalized constraint time, one finds the constraint time at point 1380, which corresponds to the nominal delay of the cell or circuit. In other words, one projects point 1380 to the horizontal axis in FIG. 25A to find a value $x_1$ on that axis. One also finds the constraint time at breakdown point 1389 by projecting that point to the horizontal axis to find point $x_2$. By dividing $x_1$ and $x_2$ by $x_1$ one arrives at values $y_1$ (which equals unity) and $$y_2 \left( \text{which equals } \frac{x_2}{x_1} \right).$$

The coordinates $x_1$ and $y_1$ define a point 1398 in FIG. 25A. Likewise, the coordinates $x_2$ and $y_2$ define a point 1401 in FIG. 25A. Next, one draws a line 1404 between points 1398 and 1401. Note that line 1404 has a mid-point 1407.

To generate a mirror-image plot, one pivots line 1404 around its mid-point 1407 to generate line 1410, as FIG. 25B illustrates. Put another way, line 1410 in FIG. 25B constitutes a mirror-image with respect to mid-point 1407 of line 1404 in FIG. 25A. Plot 1395 and line 1407 intersect at point 1413, as FIG. 25B illustrates. Point 1413 provides the value of the constraint determined by the normalized-intersection option according to the invention. Note that, under some circumstances, plot 1395 and line 1407 may intersect more than once. In that scenario, the user and/or the characterization tool should consistently choose one of the intersections (e.g. the intersection that provides the most predictability or the intersection that results in improved performance of the cell or circuit, as desired). Note also that FIGS. 22–25 show illustrative application of the degradation options to a particular attribute, namely intrinsic delay, although one may apply the degradation options to other attributes of a circuit or cell, for example, output slew-rate and power consumption, as desired.

The description of the invention included here provides illustrative embodiments of the inventive concepts. One may readily modify the described embodiments to produce alternative embodiments that nonetheless fall within the scope of the invention, as persons of ordinary skill in the art would understand. For example, although the characterization techniques shown in the appended figures illustrate the inventive concepts as applied to sequential digital circuits, one may apply those concepts to combinational circuits equally effectively. Furthermore, one may apply the described concepts to sequential circuits other than the particular circuits (e.g., a latch) used to illustrate the inventive concepts, as persons skilled in the art would appreciate.

The appended figures and the description above show the application of the invention to characterize the setup and hold constraints. One may apply the described and illustrated inventive concepts to the characterization of a variety of constraints, for example, recovery, removal, minimum pulse-width, and non-critical minimum pulse-width, and the like, by making modifications to the illustrative embodiments presented here. Those modifications fall within the knowledge of persons of ordinary skill in the art who have the benefit of this description of the inventive concepts.

As noted above, during the characterization of constraints according to the invention, one simulates the circuit or cell under test. At each step during the acquisition of constraints where one performs circuit simulation, one may perform auxiliary measurements, for example, output transition time, slew rates, switching power, hidden power, and the like, as desired. Together with the characterization results according to the invention, the auxiliary measurements may provide the user with further information and insights regarding the circuit or cell under test. The user may use the characterization results, the results of the auxiliary measurements, or both, to make decisions regarding a given design, as desired.

Furthermore, the description of the exemplary embodiments of the invention refers to performing searches or sweeping various signal edges, constraints, parameters, or attributes through techniques that include performing searches. Note that one may use any suitable search technique, as desired. For example, one may use binary search, simulated annealing, simplex search, hill climbing, or the like, as desired. The choice of a search technique or mechanism depends on the details and desired characteristics of a particular implementation of the inventive concepts, as persons of ordinary skill in the art would understand.

Further modifications and alternative embodiments of this invention will be apparent to persons skilled in the art in view of this description of the invention. Accordingly, this description teaches those skilled in the art the manner of carrying out the invention and are to be construed as illustrative only.

The forms of the invention shown and described should be taken as exemplary embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

We claim:

1. A system for characterizing an electronic circuit, comprising:
    a computer configured to:
        characterize, according to a model of an operation of the electronic circuit, a first constraint of the electronic circuit to acquire a value for the first constraint;
        characterize, according to the model of the operation of the electronic circuit, a second constraint of the electronic circuit to acquire a value for the second constraint; and
        obtain optimized values of the first and second constraints, by modifying the values acquired for the first and second constraints, so as to avoid an invalid meta-stable region of operation of the electronic circuit,
        wherein the second constraint is characterized independently of the characterization of the first constraint.

2. The system of claim 1, wherein the computer is configured to obtain optimized values of the first and second constraints by performing searches within, respectively, a first range and a second range.

3. The system of claim 2, wherein the computer is configured to determine at each step of the searches whether a criterion of circuit operation is met.

4. The system of claim 3, wherein the electronic circuit comprises a storage circuit.

5. The system of claim 4, wherein:
the first constraint comprises a setup time of the storage circuit; and
the second constraint comprises a hold time of the storage circuit.

6. The system of claim 1, in which the computer is configured to:
characterize the first constraint by using a first degraded characteristic of the electronic circuit obtained according to a first degradation option; and
characterize the second constraint by using a second degraded characteristic of the electronic circuit obtained according to a second degradation option,
wherein the first and the second degradation options are selected from a group consisting of an absolute-from-breakdown option, a unity-slope option, and a normalized intersection option.

7. The system of claim 3 in which the computer is configured to:
characterize the first constraint by using a first degraded characteristic of the electronic circuit obtained according to a first degradation option; and
characterize the second constraint by using a second degraded characteristic of the electronic circuit obtained according to a second degradation option,
wherein the first and the second degradation options are selected from a group consisting of an absolute-from-breakdown option, a unity-slope option, and a normalized intersection option.

8. The system of claim 5, in which the computer is configured to:
characterize the first constraint by using a first degraded characteristic of the storage circuit obtained according to a first degradation option; and
characterize the second constraint by using a second degraded characteristic of the storage circuit obtained according to a second degradation option,
wherein the first and the second degradation options are selected from a group consisting of an absolute-from-breakdown option, a unity-slope option, and a normalized intersection option.

9. A computer program product, comprising:
a computer application, adapted for processing by a computer, the computer application causing the computer to:
characterize, according to a model of an operation of the electronic circuit, a first constraint of the electronic circuit to acquire a value for the first constraint;
characterize, according to the model of the operation of the electronic circuit, a second constraint of the electronic circuit to acquire a value for the second constraint; and
obtain optimized values of the first and second constraints, by optimizing the values acquired for the first and second constraints, so as to avoid an invalid meta-stable region of operation of the electronic circuit,
wherein the second constraint is characterized independently of the characterization of the first constraint.

10. The computer program product of claim 9, in which the computer application is further adapted to cause the computer to obtain optimized values of the first and second constraints by performing searches within, respectively, a first range and a second range.

11. The computer program product of claim 10, in which the computer application is further adapted to cause the computer to determine at each step of the searches whether a criterion of circuit operation is met.

12. The computer program product of claim 11, wherein the electronic circuit comprises a storage circuit.

13. The computer program product of claim 12, wherein:
the first constraint comprises a setup time of the storage circuit; and
the second constraint comprises a hold time of the storage circuit.

14. The computer program product of claim 9, in which the computer application is further adapted to cause the computer to:
characterize the first constraint by using a first degraded characteristic of the electronic circuit obtained according to a first degradation option; and
characterize the second constraint by using a second degraded characteristic of the electronic circuit obtained according to a second degradation option,
wherein the first and the second degradation options are selected from a group consisting of an absolute-from-breakdown option, a unity-slope option, and a normalized intersection option.

15. The computer program product of claim 11, in which the computer application is further adapted to cause the computer to:
characterize the first constraint by using a first degraded characteristic of the electronic circuit obtained according to a first degradation option; and
characterize the second constraint by using a second degraded characteristic of the electronic circuit obtained according to a second degradation option,
wherein the first and the second degradation options are selected from a group consisting of an absolute-from-breakdown option, a unity-slope option, and a normalized intersection option.

16. The computer program product of claim 13, in which the computer application is further adapted to cause the computer to:
characterize the first constraint by using a first degraded characteristic of the storage circuit obtained according to a first degradation option; and
characterize the second constraint by using a second degraded characteristic of the storage circuit obtained according to a second degradation option,
wherein the first and the second degradation options are selected from a group consisting of an absolute-from-breakdown option, a unity-slope option, and a normalized intersection option.

17. A method of characterizing an electronic circuit, comprising:
characterizing, according to a model of an operation of the electronic circuit, a first constraint of the electronic circuit to acquire a value for the first constraint;
characterizing, according to the model of the operation of the electronic circuit, a second constraint of the electronic circuit to acquire a value for the second constraint; and
obtaining optimized values of the first and second constraints, by optimizing the values acquired for the first and second constraints, so as to avoid an invalid meta-stable region of operation of the electronic circuit,
wherein the second constraint is characterized independently of the characterization of the first constraint.

18. The method of claim 17, which further includes performing searches within, respectively, a first range and a second range to obtain the optimized values of the first and second constraints.

19. The method of claim 18, which further includes determining at each step of the searches whether a criterion of circuit operation is met.

20. The method of claim 19, wherein the electronic circuit comprises a storage circuit.

21. The method of claim 20, wherein:
the first constraint comprises a setup time of the storage circuit; and
the second constraint comprises a hold time of the storage circuit.

22. The method of claim 17, further comprising:
characterizing the first constraint by using a first degraded characteristic of the electronic circuit obtained according to a first degradation option; and
characterizing the second constraint by using a second degraded characteristic of the electronic circuit obtained according to a second degradation option,
wherein the first and the second degradation options are selected from a group consisting of an absolute-from-breakdown option, a unity-slope option, and a normalized intersection option.

23. The method of claim 19, further comprising:
characterizing the first constraint by using a first degraded characteristic of the electronic circuit obtained according to a first degradation option; and
characterizing the second constraint by using a second degraded characteristic of the electronic circuit obtained according to a second degradation option,
wherein the first and the second degradation options are selected from a group consisting of an absolute-from-breakdown option, a unity-slope option, and a normalized intersection option.

24. The method of claim 21, further comprising:
characterizing the first constraint by using a first degraded characteristic of the storage circuit obtained according to a first degradation option; and
characterizing the second constraint by using a second degraded characteristic of the storage circuit obtained according to a second degradation option,
wherein the first and the second degradation options are selected from a group consisting of an absolute-from-breakdown option, a unity-slope option, and a normalized intersection option.

* * * * *